US010720117B2

(12) United States Patent
Kim et al.

(10) Patent No.: US 10,720,117 B2
(45) Date of Patent: Jul. 21, 2020

(54) DISPLAY DEVICE

(71) Applicant: Samsung Display Co., Ltd., Yongin-si (KR)

(72) Inventors: Jonghee Kim, Yongin-si (KR); Jisun Kim, Seoul (KR); Youngwan Seo, Suwon-si (KR); Jaekeun Lim, Suwon-si (KR); Chongchul Chai, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 150 days.

(21) Appl. No.: 15/091,072

(22) Filed: Apr. 5, 2016

(65) Prior Publication Data

US 2017/0047030 A1 Feb. 16, 2017

(30) Foreign Application Priority Data

Aug. 12, 2015 (KR) ........................ 10-2015-0113893

(51) Int. Cl.
*G09G 3/36* (2006.01)
*G11C 19/28* (2006.01)
*G02F 1/1345* (2006.01)
*G09G 3/3266* (2016.01)

(52) U.S. Cl.
CPC ......... *G09G 3/3674* (2013.01); *G09G 3/3648* (2013.01); *G09G 3/3677* (2013.01); *G11C 19/287* (2013.01); *G02F 1/13454* (2013.01); *G09G 3/3266* (2013.01); *G09G 2300/0408* (2013.01); *G09G 2300/0426* (2013.01); *G09G 2310/0267* (2013.01); *G09G 2310/0286* (2013.01); *G09G 2310/0291* (2013.01)

(58) Field of Classification Search
CPC ......................... G09G 3/3674; G02F 1/13454
See application file for complete search history.

(56) References Cited

U.S. PATENT DOCUMENTS

| 8,223,111 | B2 | 7/2012 | Liao et al. |
| 8,816,728 | B2 | 8/2014 | Yoon et al. |
| 9,071,230 | B2 | 6/2015 | Kim et al. |
| 2010/0039361 | A1* | 2/2010 | Hsu ...................... G09G 3/3677 345/92 |
| 2010/0141644 | A1* | 6/2010 | Lee ...................... G09G 3/3233 345/214 |

(Continued)

FOREIGN PATENT DOCUMENTS

| CN | 103456258 | 12/2013 |
| CN | 103714789 | 4/2014 |

(Continued)

OTHER PUBLICATIONS

Extended European Search Report dated Sep. 28, 2016 in European Patent Application No. 16180201.2.

*Primary Examiner* — Kent W Chang
*Assistant Examiner* — Chayce R Bibbee
(74) *Attorney, Agent, or Firm* — H.C. Park & Associates, PLC

(57) ABSTRACT

A display device including: a display panel including a gate line and a data line; and a shift register including a stage for driving the gate line. The stage may include a first driving unit in a display area of the display panel and a second driving unit in a non-display area of the display panel.

19 Claims, 12 Drawing Sheets

(56) References Cited

U.S. PATENT DOCUMENTS

| | | | |
|---|---|---|---|
| 2012/0032937 A1* | 2/2012 | Koo | G09G 3/3233 |
| | | | 345/211 |
| 2012/0293467 A1 | 11/2012 | Lee et al. | |
| 2013/0321499 A1* | 12/2013 | Park | G09G 3/3611 |
| | | | 345/698 |
| 2014/0092078 A1 | 4/2014 | Yoon et al. | |
| 2015/0042547 A1 | 2/2015 | Kwon et al. | |
| 2015/0077407 A1 | 3/2015 | Kim et al. | |
| 2015/0206490 A1 | 7/2015 | Lim et al. | |
| 2015/0255172 A1* | 9/2015 | Kuo | G11C 19/287 |
| | | | 327/109 |
| 2015/0287392 A1 | 10/2015 | Kim et al. | |
| 2015/0325192 A1 | 11/2015 | Yoon et al. | |

FOREIGN PATENT DOCUMENTS

| | | |
|---|---|---|
| EP | 2669884 | 12/2013 |
| EP | 2713361 | 4/2014 |
| JP | 2010-218673 | 9/2010 |
| JP | 2012-242820 | 12/2012 |
| JP | 2014-071452 | 4/2014 |
| KR | 10-2013-0083151 | 7/2013 |
| KR | 10-2014-0042308 | 4/2014 |
| KR | 10-2015-0017810 | 2/2015 |
| KR | 10-2015-0019098 | 2/2015 |
| KR | 10-2015-0031899 | 3/2015 |
| KR | 10-2015-0086973 | 7/2015 |
| KR | 10-2015-0115105 | 10/2015 |

* cited by examiner

DISPLAY DEVICE

CROSS-REFERENCE TO RELATED APPLICATION

This application claims priority from and the benefit of Korean Patent Application No. 10-2015-0113893, filed on Aug. 12, 2015, which is hereby incorporated by reference for all purposes as if fully set forth herein.

BACKGROUND

Field

Embodiments of the present disclosure relate to a display device having a narrow bezel.

Discussion of the Background

Display devices have large bezels which increase as the size of the display device increases. An increase in bezel size translates to an increase in volume of the display device. The increased volume of the display device decreases a sense of an immersion into the display device.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments of the present disclosure are directed to a display device having a small bezel. In particular, various exemplary embodiments are directed to a display device that distributes driving units of a shift register into a display area and a non-display area of a display panel, thereby reducing an area required for a bezel portion.

Additional aspects will be set forth in the detailed description which follows, and, in part, will be apparent from the disclosure, or may be learned by practice of the inventive concept.

According to an exemplary embodiment, a display device includes a display panel including a gate line and a data line. The display panel also includes a shift register including a stage for driving the gate line. The stage may include a first driving unit in a display area of the display panel and a second driving unit in a non-display area of the display panel.

The stage comprises at least two first driving units that are connected to the gate line in parallel.

The stage comprises at least two first driving units configured to apply gate signals to the gate line simultaneously.

The first driving unit comprises an output switching element configured to apply a gate signal to the gate line based on a signal applied to a set node of the stage.

Each of the at least two first diving units comprises output switching elements configured to apply the gate signals to the gate line simultaneously.

The first driving unit further comprises a set switching element configured to charge the set node of the stage based on a set control signal externally applied to the set switching element.

The first driving unit further comprises a capacitor connected between the set node of the stage and the gate line.

A set control signal is at least one of a start vertical signal and a previous gate signal output from a previous stage.

The gate signal applied from the first driving unit is applied to at least one of a subsequent stage operated subsequent to the stage and a previous stage operated prior to the stage.

The second driving unit comprises: a first output discharge switching element configured to discharge the gate line based on a signal of a reset node of the stage; a second output discharge switching element configured to discharge the gate line based on a reset control signal externally applied to the second output discharge switching element; and an inverting unit configured to charge and discharge the reset node of the stage based on a first control signal and a second control signal externally applied to the inverting unit.

At least one of the first driving unit and the second driving unit further comprises a reset switching element configured to discharge the set node of the stage based on the reset control signal externally applied to the reset switching element.

The reset control signal is at least one of a dummy signal, a subsequent gate signal from a subsequent stage and a gate signal from a gate line connected to the subsequent stage.

The second driving unit comprises: a set switching element configured to charge the set node of the stage based on a set control signal externally applied to the set switching element, an output switching element configured to output a gate signal through an output terminal of the second driving unit based on a signal applied to the set node of the stage, a holding switching element configured to discharge the set node of the stage based on a signal applied to the reset node of the stage, and the reset switching element configured to discharge the set node of the stage based on the reset control signal externally applied to the reset switching element.

At least one of the set node of the stage and the reset node of the stage is positioned on at least one of the first driving unit and the second driving unit.

The inverting unit comprises: a first inverting switching element configured to charge the reset node of the stage based on the first control signal; and a second inverting switching element configured to discharge the reset node of the stage based on the second control signal.

The first control signal is a clock signal; and the second control signal is at least one of a signal applied to the set node of the stage and a gate signal of the gate line.

An output terminal of the second driving unit is connected to at least one of the gate line, a subsequent stage, and a previous stage.

The first driving unit comprises: a holding switching element configured to discharge the set node of the stage based on a signal applied to the reset node of the stage; a reset switching element configured to discharge the set node of the stage based on the reset control signal externally applied to the reset switch element; and an output discharge switching element configured to discharge the gate line based on the reset control signal externally applied to the output discharge switching element.

The second driving unit comprises a reset switching element configured to discharge the set node of the stage based on a reset control signal externally applied to the reset switching element.

The second driving unit further comprises a set switching element configured to charge the set node of the stage based on a set control signal externally applied the set switching element.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
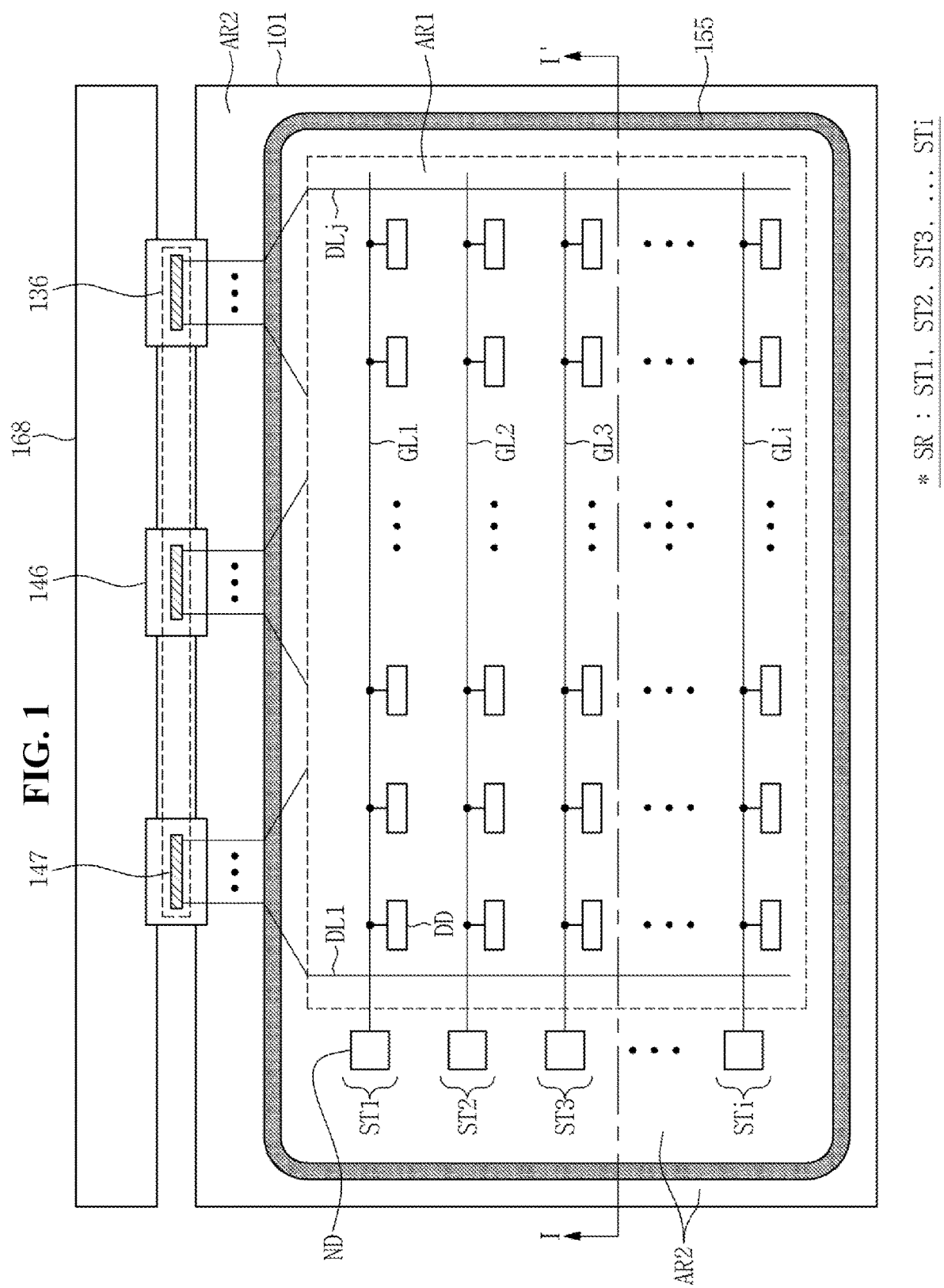
FIG. 1 is a view illustrating a display device according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

A display device may include a shift register in a non-display area. When increasing the size of the display device to meet consumer demand for large display devices, the size of the shift register and the occupying area of the shift register in the non-display area increases. As the occupying area of the shift register increases, a bezel of the display device increases (e.g., a width) in the display device also increasing the volume of the display device. When the volume of the display device increases, the display device has a lower sense of immersion than when the display device has a lower volume. Various exemplary embodiments disclose display devices with a small or narrow bezel having an increased sense of immersion when compared to a display device with a shift register only in a non-display area.

Figure 2:
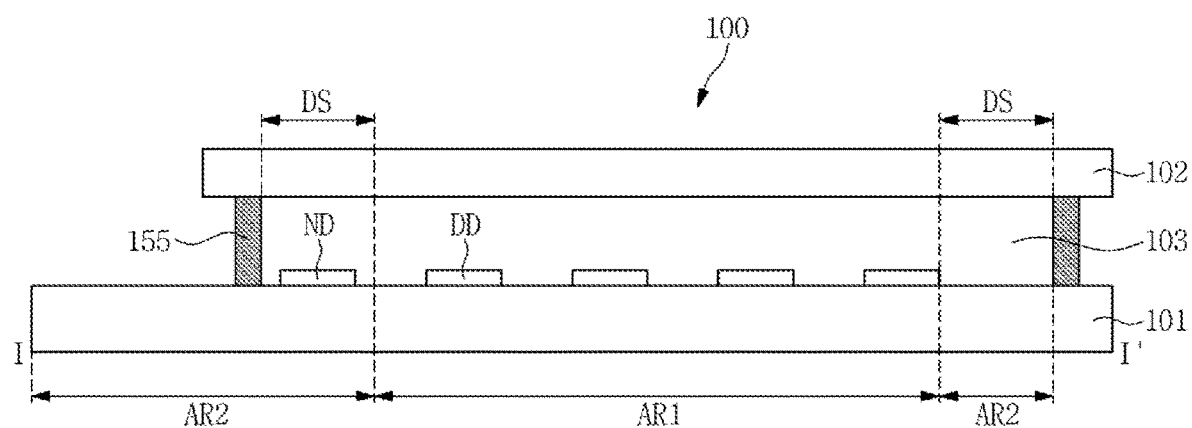
FIG. 2 is a cross-sectional view taken along line I-I' of FIG. 1.
Figure 3:
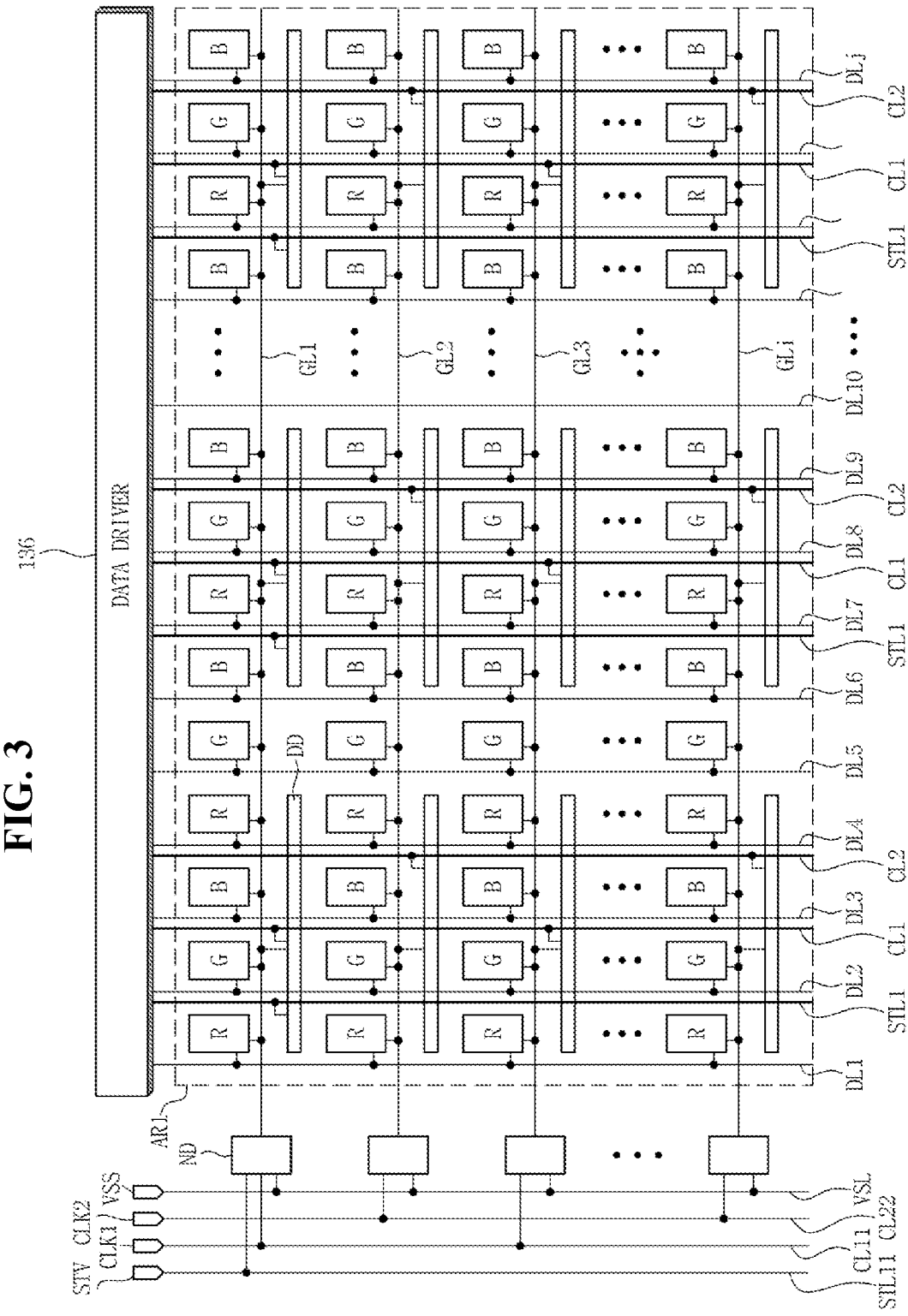
FIG. 3 is a schematic view illustrating pixels included in a display panel of FIG. 2.

FIG. 1 is a view illustrating a display device according to an exemplary embodiment. FIG. 2 is a cross-sectional view taken along line I-I' of FIG. 1. FIG. 3 is a schematic view illustrating pixels included in a display panel 100 of FIG. 2.

The display device according to an exemplary embodiment, as illustrated in FIGS. 1 and 2, includes the display panel 100, a data driver 136, a shift register SR, and a circuit board 168.

The display panel 100, as illustrated in FIG. 2, may include a lower panel 101, an upper panel 102, a liquid crystal layer 103, and a sealing portion 155. The display panel 100 is divided into a display area AR1 and a non-display area AR2.

The display panel 100 may be a panel used in various types of display devices, such as a liquid crystal display ("LCD") panel and an organic light emitting diode ("OLED") panel.

The sealing portion 155 is disposed between the lower panel 101 and the upper panel 102. In detail, the sealing portion 155, as illustrated in FIG. 2, is disposed between the non-display area AR2 of the lower panel 101 and the non-display area AR2 of the upper panel 102. The sealing portion 155, for example, as illustrated in FIG. 1, may have a closed-loop shape surrounding the display area AR1.

The liquid crystal layer 103 may be positioned in a space surrounded by the lower panel 101, the upper panel 102, and the sealing portion 155. The liquid crystal layer 103 may have a negative dielectric anisotropy and may include liquid crystal molecules in homeotropic alignment. Alternatively, the liquid crystal layer 103 may include a photopolymerization material, and such a photopolymerization material may be a reactive monomer or a reactive mesogen.

As illustrated in FIG. 2, the lower panel 101 may have an area greater than that of the upper panel 102. The lower panel 101 and the upper panel 102 may face each other with the liquid crystal layer 103 interposed therebetween.

The lower panel 101 may include a plurality of gate lines GL1 to GLi and a plurality of data lines DL1 to DLj. The gate lines GL1 to GLi and the data lines DL1 to DLj may be disposed on a lower substrate of the lower panel 101.

The upper panel 102 may include a light blocking layer configured to define a pixel area. The light blocking layer may be included in the lower panel 101. The light blocking layer may block light from being emitted toward a portion aside from the pixel area.

As shown in FIGS. 1 and 3, the data lines DL1 to DLj intersect the gate lines GL1 to GLi. The data lines DL1 to DLj extend to the non-display area AR2 to be connected to the data driver 136.

The data driver 136 may include a plurality of data driving integrated circuits (ICs) 147. The data driving ICs 147 may receive a digital image data signal and a data control signal applied from a timing controller. The data driving ICs 147 may sample the digital image data signal according to the data control signal, latch the sampled image data signal corresponding to one horizontal line each horizontal period, and apply the latched image data signal to the data lines DL1 to DLj. That is, the data driving ICs 147 may convert the digital image data signal applied from the timing controller into an analog image data signal using a gamma voltage input from a power supply (not illustrated) and apply the converted analog image data signals to the data lines DL1 to DLj.

The data driving ICs 147 may be mounted on data carriers 146, respectively. The data carriers 146 may be connected between the circuit board 168 and the lower panel 101. For example, each of the data carriers 146 may be electrically connected between the circuit board 168 and the non-display area AR2 of a lower substrate.

The aforementioned timing controller and power supply may be disposed on the circuit board 168. The data carrier 146 may include input wirings configured to transmit various signals from the timing controller and the power supply to the data driving IC 147. The data carrier 146 may also include output wirings configured to transmit image data signals output from the data driving IC 147 to the corresponding data lines DL1 to DLj, respectively. Meanwhile, at least one carrier 146 may further include auxiliary wirings configured to transmit various signals from the timing controller and the power supply to the shift register SR. The auxiliary wirings may be connected to panel wirings on the lower panel 101. The panel wirings may connect the auxiliary wirings and the shift register SR. The panel wirings may be formed in the non-display area AR2 of the lower panel 101 in a line-on-glass manner.

The display panel 100 may include a plurality of pixels R, G, and B. The pixels R, G, and B, as illustrated in FIG. 3, may be disposed in the display area AR1 of the display panel 100.

The pixels R, G, and B may be arranged in a matrix form. The pixels R, G, and B may be classified into red pixels R displaying a red color, green pixels G displaying a green color, and blue pixels B displaying a blue color. In such an exemplary embodiment, the red pixel R, the green pixel G, and the blue pixel B that are adjacently disposed in a horizontal direction may form a unit pixel for displaying a unit image.

There may be "j" number of pixels arranged along an $n^{th}$ (n is one selected from 1 to i) horizontal line (hereinafter, $n^{th}$ horizontal line pixels) connected to the first to $j^{th}$ data lines DL1 to DLj, respectively. The $n^{th}$ horizontal line pixels may be connected to the $n^{th}$ gate line together. The $n^{th}$ horizontal line pixels may receive an $n^{th}$ gate signal as a common signal. That is, "j" number of pixels arranged on the same horizontal line may receive the same gate signal, while pixels arranged on different horizontal lines may receive different gate signals.

Each of the pixels R, G, and B, although not illustrated, may include a thin film transistor, a liquid crystal capacitor, and a storage capacitor.

The thin film transistor may be turned on according to a gate signal applied from the gate line. The turned-on thin film transistor may apply an analog image data signal from the data line to the liquid crystal capacitor and the storage capacitor.

The liquid crystal capacitor may include a pixel electrode and a common electrode opposing each other.

The storage capacitor may include a pixel electrode and an opposing electrode facing each other. The opposing electrode may be a previous gate line or a transmission line that transmits a common voltage.

The gate lines GL1 to GLi may be operated by a gate driver. The gate driver may include a shift register SR as illustrated in FIG. 1.

The shift register SR, as illustrated in FIG. 1, may include a plurality of stages ST1, ST2, ST3, . . . , and STi. The plurality of stages ST1 to STi are connected to the plurality of gate lines GL1 to GLi, respectively. The respective stages ST1 to STi drive the connected gate lines GL1 to GLi, respectively. For example, one of the stages ST1 to STi applies a gate signal to a corresponding one of the gate lines GL1 to GLi to drive the corresponding one of the gate lines GL1 to GLi.

Although not illustrated, the shift register SR may further include a dummy stage which outputs a dummy gate signal to reset the $i^{th}$ stage. Based on the configuration of the shift register SR, two or more dummy stages may be provided.

The stages ST1 to STi may receive a set control signal and a reset control signal. The set control signal applied to a predetermined one of the stages ST1 to STi may be a gate signal output from at least one of the stages (e.g., previous stages) that are operated prior to the predetermined one of the stages ST1 to STi. In addition, the reset control signal applied to the predetermined one of the stages ST1 to STi may be a gate signal output from at least one of the stages (e.g., subsequent stages) that are operated subsequent to the predetermined one of the stages ST1 to STi. The previous stage may refer to a stage that outputs a gate signal prior to the predetermined one of the stages ST1 to STi in a single frame period FR, and the subsequent stage may refer to a stage that outputs a gate signal subsequent to the predetermined one of the stages ST1 to STi in a single frame period FR.

In a case where the predetermined one of the stages ST1 to STi is a first stage, for example, the first stage ST1, operated firstly in a single frame period FR, the set control signal applied thereto may be a start vertical signal STV notifying the start of a single frame. The start vertical signal STV may be output from at least one of the timing controller and the data driver 136.

In a case where the predetermined stage is a last stage (e.g., the $i^{th}$ stage STi), operated last in a single frame period FR, the reset control signal applied thereto may be a dummy gate signal output from the dummy stage. In an exemplary embodiment, the start vertical signal STV is used as the reset control signal of the $i^{th}$ stage STi. In such an exemplary embodiment, the first stage ST1 is set based on the start vertical signal STV, and the $i^{th}$ stage STi is reset along therewith.

The respective stages ST1 to STi may drive the gate lines GL1 to GLi respectively connected thereto using a gate signal. Each of the stages ST1 to STi may control a stage positioned subsequent thereto and a stage positioned prior thereto using the gate signal.

Although not illustrated, a dummy stage that applies a dummy gate signal to the $i^{th}$ stage may further be positioned subsequent to the $i^{th}$ stage. Based on a configuration of the shift register SR, a plurality of dummy stages may be provided rather than only a single dummy stage. The dummy stage may not be connected to the gate line. The dummy stage may be set based on the gate signal applied from the $i^{th}$ stage and may be reset based on the start vertical signal STV.

Based on the configuration of the shift register SR, each of the stages ST1 to STi may only control an operation of the stage positioned prior thereto using the gate signal.

The stages ST1 to STi may sequentially generate gate signals from the first stage to the $i^{th}$ stage. Subsequent to a last gate signal being generated from the $i^{th}$ stage, the dummy stage may output a dummy gate signal. The dummy gate signal may not be applied to the gate line, and may be only applied to the $i^{th}$ stage.

At least one stage may include at least one display driving unit DD and at least one non-display driving unit ND. FIG. 1 illustrates an exemplary embodiment in which the stages ST1 to STi each include a single non-display unit ND and a plurality of display driving units DD.

The display driving units DD provided in each stage may be disposed in the display area AR1 of the display panel 100, and the non-display driving units ND may be disposed in the non-display area AR2 of the display panel 100. For example, the non-display driving units ND may be positioned in the non-display area AR2 between the sealing portion 155 and the display area AR1. An area between the sealing portion 155 and the display area AR1 is also referred to as a dead space DS, and the non-display driving units ND may be disposed in the dead space DS.

The display driving units DD and the non-display driving units ND may be disposed to correspond to a light blocking layer. That is, the display driving units DD and the non-display driving units ND may be covered by the light blocking layer.

The display driving units DD and the non-display driving unit ND included in a stage may be connected to the gate line. In such an exemplary embodiment, at least two of the display driving units DD may be connected to the gate line in parallel. At least two of the display driving units DD may apply gate signals to the gate line simultaneously. For example, at least two of the display driving units DD connected to the first gate line GL1 of FIG. 1 may apply gate signals to the first gate line GL1 simultaneously.

At least one non-display driving unit ND and at least one display driving unit DD connected to a single gate line in common may apply gate signals to the gate line simultaneously.

The at least one display driving unit DD may not be connected to the gate line, and may only be connected to at least one of the non-display driving units ND.

At least some of the display driving units DD connected to the single gate line in common may have the same configuration.

The display panel 100, as illustrated in FIG. 3, may include a vertical line STL11, a first clock line CL11, a second clock line CL22, and a discharge power line VSL in the non-display area AR2, and a vertical line STL1, a first clock line CL1, and a second clock line CL2 in the display area AR1.

The vertical line STL11, the first clock line CL11, the second clocking line CL22, and the discharge power line VSL in the non-display area AR2 may be substantially parallel to the data lines DL1 to DLj. The vertical line STL11, the first clock line CL11, the second clocking line CL22, and the discharge power line VSL in the non-display area AR2 do not cross the gate lines GL1 to GLi.

The vertical line STL11 of the non-display area AR2 may transmit the start vertical signal STV, the first clock line CL11 of the non-display area AR2 may transmit a first clock signal CLK1, the second clock line CL22 of the non-display area AR2 may transmit a second clock signal CLK2, and the discharge power line VSL of the non-display area AR2 may transmit a discharge voltage VSS. In such an exemplary embodiment, the start vertical signal STV, the first clock signal CLK1, and the second clock signal CLK2 may be applied from the timing controller. That is, the vertical line STL11, the first clock line CL11, and the second clock line CL22 in the non-display area AR2 may receive the start vertical signal STV, the first clock signal CLK1, and the second clock signal CLK2 output from the timing controller, respectively. The discharge voltage VSS may be applied from the power supply (not illustrated).

The vertical line STL1, the first clock line CL1, and the second clock line CL2 in the display area AR1 may be substantially parallel to data lines DL1 to DLj. The vertical line STL1, the first clock line CL1, and the second clock line CL2 in the display area AR1 may also be disposed among adjacent pixels. The vertical line STL1, the first clock line CL1, and the second clocking line CL2 in the display area AR1 cross the gate lines GL1 to GLi.

The vertical line STL1 of the display area AR1 may transmit the start vertical signal STV, the first clock line CL1 of the display area AR1 may transmit the first clock signal CLK1, and the second clock line CL2 of the display area AR1 may transmit the second clock signal CLK2. In such an exemplary embodiment, the start vertical signal STV, the first clock signal CLK1, and the second clock signal CLK2 may be applied from the data driver 136. That is, the vertical line STL1, the first clock line CL1, and the second clock line CL2 of the display area AR1 may receive the start vertical signal STV, the first clock signal CLK1, and the second clock signal CLK2 output from the data driver 136.

The start vertical signal STV applied to the vertical line STL11 in the non-display area AR2 may be the same as the start vertical signal STV applied to the vertical line STL1 in the display area AR1. The first clock signal CLK1 applied to the first clock line CL11 in the non-display area AR2 may be the same as the first clock signal CLK1 applied to the first clock line CL1 in the display area AR1. The second clock signal CLK2 applied to the second clock line CL22 in the non-display area AR2 may be the same as the second clock signal CLK2 applied to the second clock line CL2 in the display area AR1.

At least two non-display driving units ND among the non-display driving units ND may be connected to the first clock line CL11 of the non-display area AR2 in common, while the other non-display driving units ND may be connected to the second clock line CL22 of the non-display area AR2 in common. For example, as illustrated in FIG. 3, the non-display driving units ND of odd-numbered stages ST1, ST3, . . . may be connected to the first clock line CL11 in common, and the non-display driving units ND of even-numbered stages ST2, . . . , STi may be connected to the second clock line CL22 in common. A non-display driving unit ND that is operated firstly in a single frame period FR among the non-display driving units ND may further be connected to the vertical line STL11.

At least two driving units DD among the display driving units DD disposed in a line along the data line in the display area AR1 may be connected to the first clock line CL1 of the display area AR1 in common, and the other display driving units DD may connected to the second clock line CL2 of the display area AR1 in common. For example, as illustrated in FIG. 3, the display driving units DD of the odd-numbered stages ST1, ST3, . . . may be connected to the first clock line CL1 of the display area AR1 in common, and the display driving units DD of the even-numbered stages ST2, . . . , STi may be connected to the second clock line CL2 of the display area AR1 in common. A display driving unit DD that is operated firstly in a single frame period FR among the display driving units DD may further be connected to the vertical line STL1.

Figure 4:
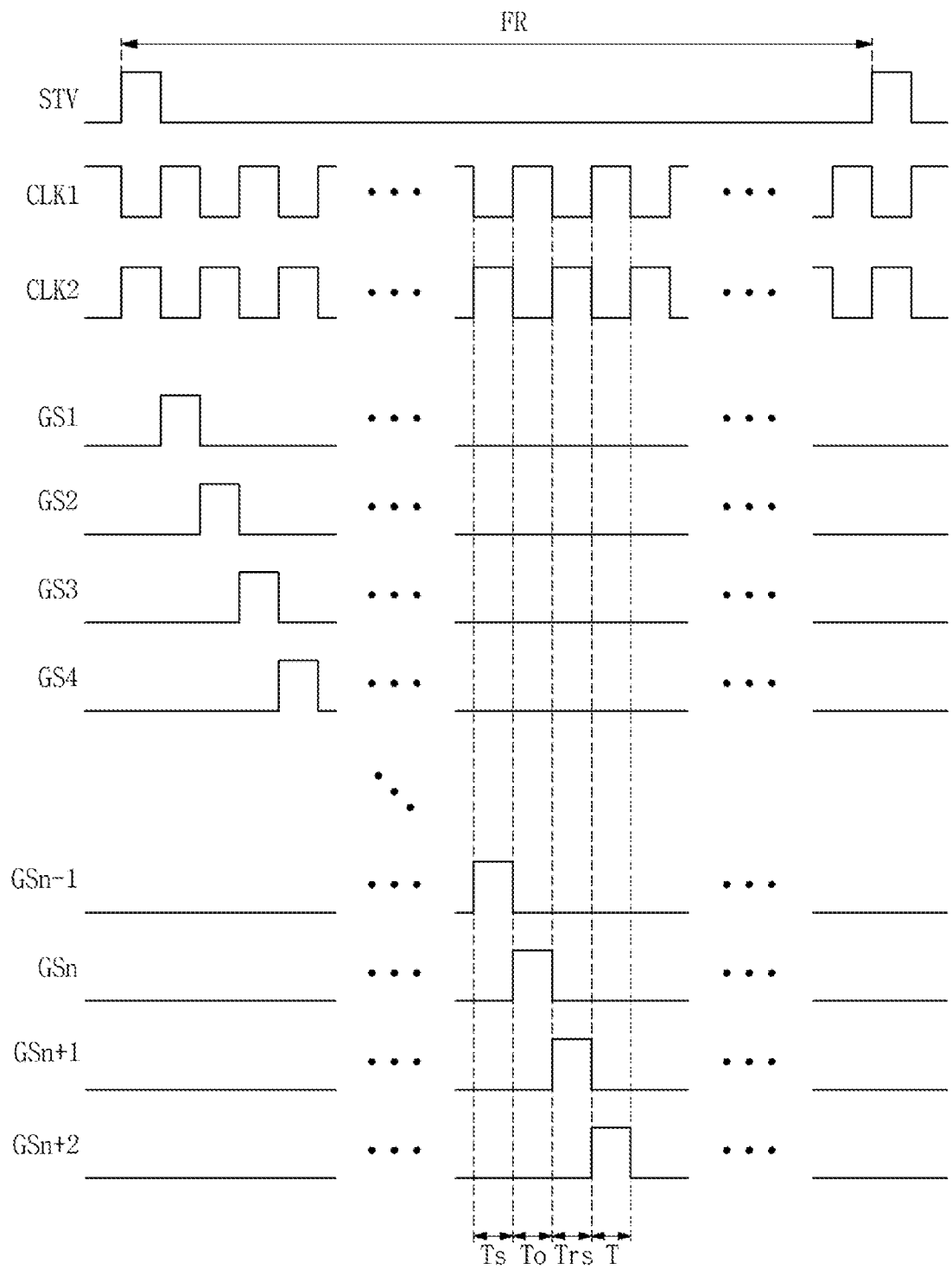
FIG. 4 is a waveform diagram illustrating waveforms of a start vertical signal, a first clock signal, and a second clock signal transmitted through a vertical line, a first clock line, and a second clock line of FIG. 3 and waveforms of gate signals output based on the signals.

FIG. 4 is a waveform diagram illustrating waveforms of the start vertical signal STV, the first clock signal CLK1, and the second clock signal CLK2 transmitted through the vertical lines STL11 and STL1, first clock lines CL11 and CL1, second clock lines CL22 and CL2 of FIG. 3, and waveforms of gate signals output based on the signals.

As illustrated in FIG. 4, the first clock signal CLK1 has a 180 degree inverted phase with respect to a phase of the second clock signal CLK2.

The first clock signal CLK1 and the second clock signal CLK2 may be signals used to generate the gate signals of the respective stages ST1 to STi, and each of the stages ST1 to STi may receive at least one of the first clock signal CLK1 and the second clock signal CLK2 to output the gate signals. For example, the odd-numbered stages ST1, ST3, . . . may output the gate signal using the first clock signal CLK1, and the even-numbered stages ST2, . . . , STi may output the gate signal using the second clock signal CLK2.

The first clock signal CLK1 may be a pulse signal periodically having a high voltage and a low voltage. The high voltage of the first clock signal CLK1 may have a level that may turn on a switching element of the stage to be described below. The second clock signal CLK2 may also be a pulse signal periodically having a high voltage and a low voltage. The high voltage of the second clock signal CLK2 may have a level that may turn on the switching element of the stage to be described below.

The low voltage of the first clock signal CLK1 may have a level that may turn off the switching element of the stage to be described below. The low voltage of the second clock signal CLK2 may also a level that may turn off the switching element of the stage to be described below.

The low voltage of the first clock signal CLK1 may be the same as the aforementioned discharge voltage VSS. The low voltage of the second clock signal CLK2 may also be the same as the aforementioned discharge voltage VSS.

The start vertical signal STV may be applied to the first stage ST1 that is operated firstly in time in a single frame period FR. The start vertical signal STV may serve to set the first stage ST1.

The start vertical signal STV may be output first in the single frame period FR, prior to the first clock signal CLK1 and the second clock signal CLK2. Each of the clock signals CLK1 and CLK2 may have the high voltage signal a plurality of times in the single frame period FR, while the start vertical signal STV may have the high voltage signal only a single time in the single frame period FR.

Two types of clock signals having a phase difference, for example, the first and second clock signals CLK1 and CLK2, are illustrated in FIG. 4. However, three or more types of clock signals having a phase difference may be used.

Although not illustrated, the first and second clock signals CLK1 and CLK2 may overlap each other while being output. For example, in a case where the high period of the first clock signal CLK1 is divided into a first half period and a second half period and the high period of the second clock signal CLK2 is divided into a first half period and a second half period, the second half period of the first clock signal CLK1 and the first half period of the second clock signal CLK2 may overlap each other in time.

The start vertical signal STV may overlap at least one of the first clock signal CLK1 and the second clock signal CLK2. In this case, the start vertical signal STV may overlap the clock signal completely or may overlap a part of the clock signal.

Hereinafter, configurations of the respective stages ST1 to STi will be described with reference to FIG. 5. The configurations of the respective stages ST1 to STi are substantially the same as one another, and thus the $n^{th}$ stage STn will be representatively described.

Figure 5:
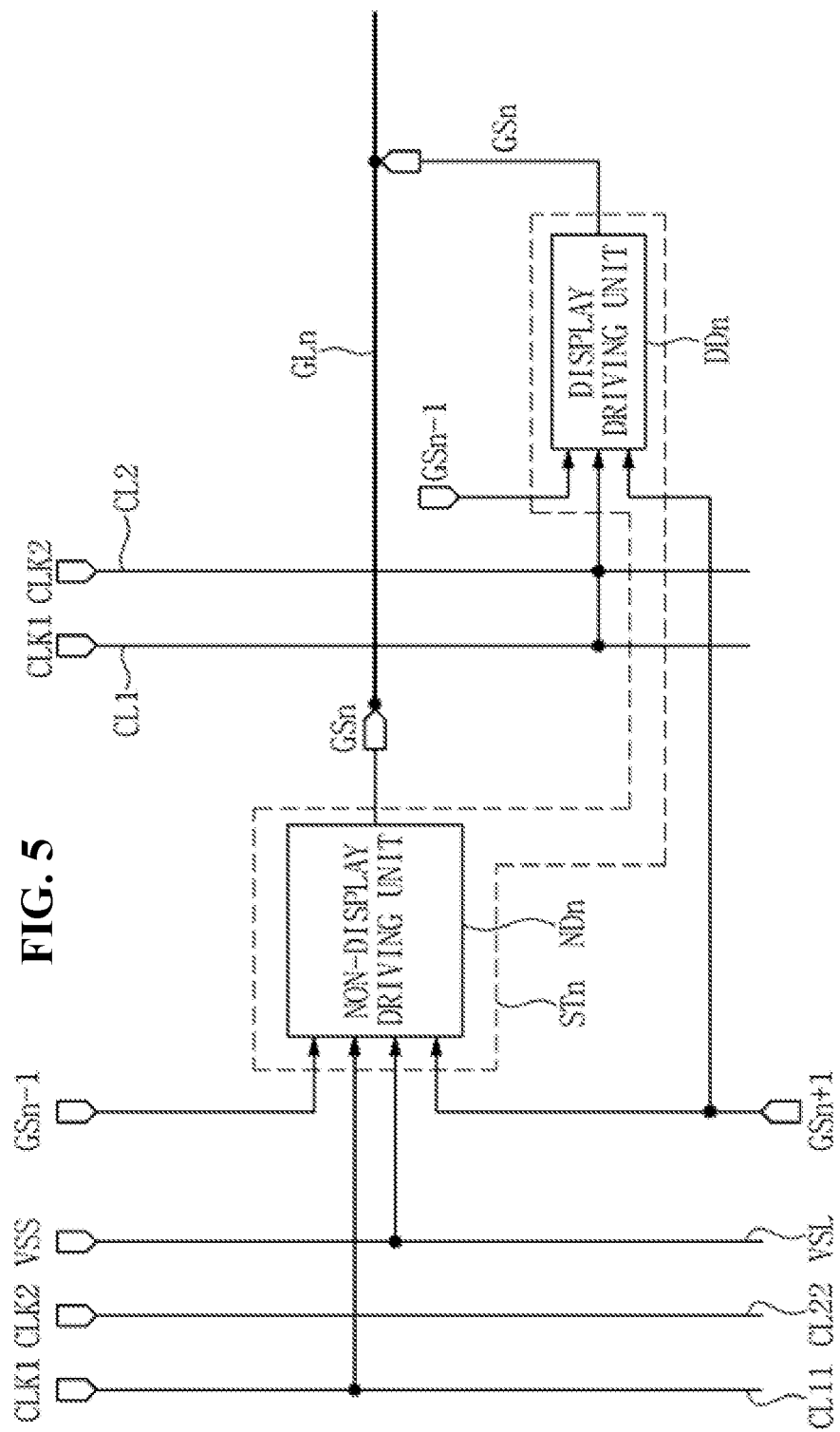
FIG. 5 is a block diagram illustrating an $n^{th}$ stage of FIG. 1.

FIG. 5 is a block diagram illustrating the $n^{th}$ stage STn of FIG. 1.

The $n^{th}$ stage STn, for example, as illustrated in FIG. 5, includes a single display driving unit DDn and a single non-display driving unit NDn.

The $n^{th}$ stage STn may receive an $n-1^{th}$ gate signal GSn−1 as a set control signal and may receive an $n+1^{th}$ gate signal GSn+1 as a reset control signal.

The $n-1^{th}$ gate signal GSn−1 is output from the $n-1^{th}$ stage, and the $n+1^{th}$ gate signal GSn+1 is output from an $n+1^{th}$ stage. Based on the configuration of the stage, the set control signal may be a gate signal output from a stage that is positioned further ahead, for example, an $n-y^{th}$ gate signal (y is a natural number greater than 2 and smaller than "n"), and the reset control signal may be a gate signal output from a stage that is positioned further behind, for example, an $n+z^{th}$ gate signal (z is a natural number greater than 2). However, in a case where the $n^{th}$ stage STn is the first stage ST1 that is operated first in a single frame period FR, the $n^{th}$ stage STn may receive the start vertical signal STV rather than the gate signal applied from the previous stage to thereby be set. In a case where the $n^{th}$ stage STn is the $i^{th}$ stage STi that is operated last in a single frame period FR, the $n^{th}$ stage STn may receive the start vertical signal STV or a dummy gate signal to be reset.

The $n-1^{th}$ gate signal GSn−1 may be applied to at least one of the display driving unit DDn and the non-display driving unit NDn. For example, FIG. 5 illustrates a case in which the $n-1^{th}$ gate signal GSn−1 is applied to both of the display driving unit DDn and the non-display driving unit NDn. In such an exemplary embodiment, the display driving unit DDn of the $n^{th}$ stage STn may receive the $n-1^{th}$ gate signal GSn−1 output from a display driving unit of the $n-1^{th}$ stage, and the non-display driving unit NDn of the $n^{th}$ stage STn may receive the $n-1^{th}$ gate signal GSn−1 output from a non-display driving unit of the $n-1^{th}$ stage. In an exemplary embodiment, the display driving unit DDn and the non-display driving unit NDn of the $n^{th}$ stage STn may receive the $n-1^{th}$ gate signal GSn−1 output from the display driving unit of the $n-1^{th}$ stage as a common signal. In another exemplary embodiment, the display driving unit DDn and the non-display driving unit NDn of the $n^{th}$ stage STn may receive the $n-1^{th}$ gate signal GSn−1 output from the non-display driving unit of the $n-1^{th}$ stage as a common signal.

The $n+1^{th}$ gate signal GSn+1 may be applied to at least one of the display driving unit DDn and the non-display driving unit NDn. For example, FIG. 5 illustrates a case in which the $n+1^{th}$ gate signal GSn+1 is applied to both of the display driving unit DDn and the non-display driving unit NDn. In such an exemplary embodiment, the display driving unit DDn of the $n^{th}$ stage STn may receive the $n+1^{th}$ gate signal GSn+1 output from a display driving unit of the $n+1^{th}$ stage, and the non-display driving unit NDn of the $n^{th}$ stage STn may receive the $n+1^{th}$ gate signal GSn+1 output from a non-display driving unit of the $n+1^{th}$ stage. In an exemplary embodiment, the display driving unit DDn and the non-display driving unit NDn of the $n^{th}$ stage STn may receive the $n+1^{th}$ gate signal GSn+1 output from the display driving unit of the $n+1^{th}$ stage as a common signal. In another exemplary embodiment, the display driving unit DDn and the non-display driving unit NDn of the $n^{th}$ stage STn may receive the $n+1^{th}$ gate signal GSn+1 output from the non-display driving unit of the $n+1^{th}$ stage as a common signal.

The clock signal may be applied to at least one of the display driving unit DDn and the non-display driving unit NDn. For example, a case in which the first clock signal CLK1 is applied to both of the display driving unit DDn and the non-display driving unit NDn is illustrated in FIG. 5. In such an exemplary embodiment, the first clock signal CLK1 applied to the display driving unit DDn may be applied through a clock line which is different from a clock line through which the first clock signal CLK1 is applied to the non-display driving unit NDn. For example, the display driving unit DDn may receive the first clock signal CLK1 through the first clock line CL1 in the display area AR1, and the non-display driving unit NDn may receive the first clock signal CLK1 through a first clock line CL11 in the non-display area AR2. In an exemplary embodiment, both of the display driving unit DDn and the non-display driving unit NDn may receive the first clock signal CLK1 through the first clock line CL1 in the display area AR1 in common. In another exemplary embodiment, both of the display driving unit DDn and the non-display driving unit NDn may receive the first clock signal CLK1 from the first clock line CL11 in the non-display area AR2 in common. In an exemplary embodiment, the display driving unit DDn may receive the second clock signal CLK2 in the display area AR1.

The display driving unit DDn of the $n^{th}$ stage STn may be set by a set control signal, such as the $n-1^{th}$ gate signal GSn−1. The display driving unit DDn of the $n^{th}$ stage STn that is set generates the $n^{th}$ gate signal GSn using the first clock signal CLK1, and applies the $n^{th}$ gate signal GSn to the $n^{th}$ gate line GLn. In such an exemplary embodiment, the $n^{th}$ gate signal GSn output from the display driving unit DDn of the $n^{th}$ stage STn may further be applied to at least one of the $n-1^{th}$ stage and the $n+1^{th}$ stage. For example, the $n^{th}$ gate signal GSn may be applied to the display driving unit of the $n+1^{th}$ stage and the display driving unit of the $n-1^{th}$ stage.

The display driving unit DDn of the $n^{th}$ stage STn may be reset by the reset control signal such as the $n+1^{th}$ gate signal GSn+1. The display driving unit DDn of the $n^{th}$ stage STn that is reset may block output of the $n^{th}$ gate signal GSn. For example, the display driving unit DDn of the $n^{th}$ stage STn that is reset may prevent the first clock signal CLK1 applied thereto from being output to the $n^{th}$ gate line GLn. So as to stabilize the signal of the $n^{th}$ gate line GLn, the display driving unit DDn of the $n^{th}$ stage STn that is reset may further perform an operation to output the discharge voltage VSS to the $n^{th}$ gate line GLn.

The non-display driving unit NDn of the $n^{th}$ stage STn may be set by a set control signal, such as the $n-1^{th}$ gate signal GSn−1. The non-display driving unit NDn of the $n^{th}$ stage STn that is set may generate the $n^{th}$ gate signal GSn using the first clock signal CLK1, and may apply the $n^{th}$ gate signal GSn to the $n^{th}$ gate line GLn. In such an exemplary embodiment, the $n^{th}$ gate signal GSn output from the non-display driving unit NDn of the $n^{th}$ stage STn may further be applied to at least one of the $n-1^{th}$ stage and the $n+1^{th}$ stage. For example, the $n^{th}$ gate signal GSn may be applied to the non-display driving unit NDn of the $n+1^{th}$ stage and the non-display driving unit of the $n-1^{th}$ stage.

The non-display driving unit NDn of the $n^{th}$ stage STn may be reset by a reset control signal, such as the $n+1^{th}$ gate signal GSn+1. The non-display driving unit NDn of the $n^{th}$ stage STn that is reset may block output of the n$^{th}$ gate signal GSn. For example, the non-display driving unit NDn of the n$^{th}$ stage STn that is reset may prevent the first clock signal CLK1 applied thereto from being output to the n$^{th}$ gate line GLn. So as to stabilize the signal of the n$^{th}$ gate line GLn, the display driving unit DDn of the n$^{th}$ stage STn that is reset may further perform an operation to output the discharge voltage VSS to the n$^{th}$ gate line GLn.

Unlike the configuration illustrated in FIG. 5, the non-display driving unit NDn of the n$^{th}$ stage STn may not be connected to the gate line. In exemplary embodiments, the n$^{th}$ gate signal GSn output to the non-display driving unit NDn of the n$^{th}$ stage STn is only applied to at least one of the n+1$^{th}$ stage and the n−1$^{th}$ stage. That is, the n$^{th}$ gate signal GSn applied from the non-display driving unit NDn of the n$^{th}$ stage STn may not be applied to any gate line including the n$^{th}$ gate line GLn. In such an exemplary embodiment, the non-display driving unit NDn of the n$^{th}$ stage STn controls an operation of the display driving unit DDn of the n$^{th}$ stage STn. For example, the non-display driving unit NDn of the n$^{th}$ stage STn may reset the display driving unit DDn of the n$^{th}$ stage STn.

Figure 6:
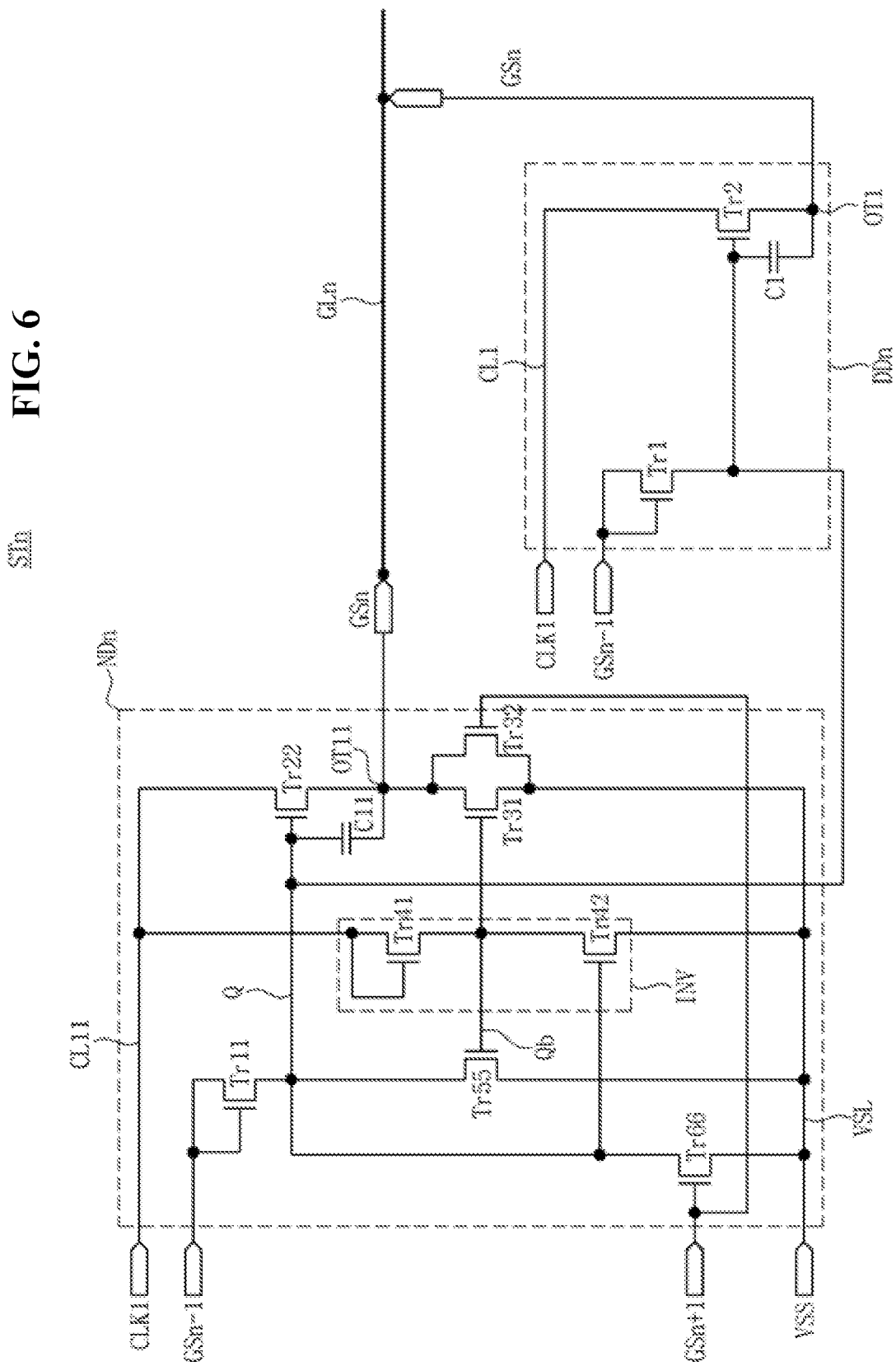
FIG. 6 is a detailed configuration view illustrating the $n^{th}$ stage of FIG. 5.

FIG. 6 is a detailed configuration view illustrating the n$^{th}$ stage STn of FIG. 5.

The display driving unit DDn of the n$^{th}$ stage STn (hereinafter, "n$^{th}$ display driving unit DDn"), as illustrated in FIG. 6, may include a set switching element Tr1, an output switching element Tr2, and a capacitor C1.

The set switching element Tr1 of the n$^{th}$ display driving unit DDn may charge the set node Q of the n$^{th}$ stage STn based on a set control signal externally applied thereto. The set control signal may be the n−1$^{th}$ gate signal GSn−1 applied from the n−1$^{th}$ stage. The set switching element Tr1 of the n$^{th}$ display driving unit DDn may be turned on or turned off based on the n−1$^{th}$ gate signal GSn−1 applied from the n−1$^{th}$ stage. When being turned on, the set switching element Tr1 may electrically connect an output terminal of the n−1$^{th}$ stage and the set node Q of the n$^{th}$ stage STn. The n−1$^{th}$ stage may output the n−1$^{th}$ gate signal GSn−1 through the output terminal thereof.

The output switching element Tr2 of the n$^{th}$ display driving unit DDn may apply the n$^{th}$ gate signal GSn to the n$^{th}$ gate line GLn based on a signal applied to the set node Q of the n$^{th}$ stage STn. The output switching element Tr2 of the n$^{th}$ display driving unit DDn may output the first clock signal CLK1 as the n$^{th}$ gate signal GSn. The output switching element Tr2 of the n$^{th}$ display driving unit DDn may be turned on or turned off based on the signal of the set node Q of the n$^{th}$ stage STn. When being turned on, the output switching element Tr2 may electrically connect the first clock line CL1 and the n$^{th}$ gate line GLn in the display area AR1. In such an exemplary embodiment, the output switching element Tr2 may be connected to the n$^{th}$ gate line GLn through the output terminal OT1 of the n$^{th}$ display driving unit DDn.

The capacitor C1 of the n$^{th}$ display driving unit DDn may be connected between the set node Q of the n$^{th}$ stage STn and the n$^{th}$ gate line GLn. The capacitor C1 may be substituted with a parasitic capacitor C1 between a gate electrode and a drain electrode of the output switching element Tr2. In such an exemplary embodiment, the drain electrode of the output switching element Tr2 may correspond to the output terminal OT1 of the n$^{th}$ display driving unit DDn.

The non-display driving unit NDn of the n$^{th}$ stage STn (hereinafter, "n$^{th}$ non-display driving unit NDn"), as illustrated in FIG. 6, may include a set switching element Tr11, an output switching element Tr22, a first output discharge switching element Tr31, a second output discharge switching element Tr32, an inverting unit INV, a holding switching element Tr55, a reset switching element Tr66, and a capacitor C11.

The set switching element Tr11 of the n$^{th}$ non-display driving unit NDn may charge the set node Q of the n$^{th}$ stage STn based on a set control signal externally applied thereto. The set control signal may be the n−1$^{th}$ gate signal GSn−1 applied from the n−1$^{th}$ stage. The set switching element Tr11 of the n$^{th}$ non-display driving unit NDn may be turned on or turned off based on the n−1$^{th}$ gate signal GSn−1 applied from the n−1$^{th}$ stage. When being turned on, the set switching element Tr11 may electrically connect the output terminal of the n−1$^{th}$ stage and the set node Q of the n$^{th}$ stage STn. The n−1$^{th}$ stage outputs the n−1$^{th}$ gate signal GSn−1 through the output terminal thereof.

The output switching element Tr22 of the n$^{th}$ non-display driving unit NDn may apply the n$^{th}$ gate signal GSn to the n$^{th}$ gate line GLn based on a signal applied to the set node Q of the n$^{th}$ stage STn. The output switching element Tr22 of the n$^{th}$ non-display driving unit NDn may outputs the first clock signal CLK1 as the n$^{th}$ gate signal GSn. The output switching element Tr22 of the n$^{th}$ non-display driving unit NDn may be turned on or turned off based on the signal of the set node Q of the n$^{th}$ stage STn. When being turned on, the output switching element Tr22 may electrically connect the n$^{th}$ gate line GLn and the first clock line CL11 in the non-display area AR2. In such an exemplary embodiment, the output switching element Tr2 may be connected to the n$^{th}$ gate line GLn through the output terminal OT11 of the n$^{th}$ non-display driving unit NDn.

The first output discharge switching element Tr31 of the n$^{th}$ non-display driving unit NDn may discharge the n$^{th}$ gate line GLn based on the signal of the reset node Qb of the n$^{th}$ stage STn. The first output discharge switching element Tr31 of the n$^{th}$ non-display driving unit NDn may be turned on or turned off based on the signal of the reset node Qb of the n$^{th}$ stage STn. When being turned on, the first output discharge switching element Tr31 may electrically connect the n$^{th}$ gate line GLn and the discharge power line VSL.

The second output discharge switching element Tr32 of the n$^{th}$ non-display driving unit NDn may discharge the n$^{th}$ gate line GLn based on a reset control signal externally applied thereto. The reset control signal may be the n+1$^{th}$ gate signal GSn+1 applied from the n+1$^{th}$ stage. The second output discharge switching element Tr32 of the n$^{th}$ non-display driving unit NDn may be turned on or turned off based on the n+1$^{th}$ gate signal GSn+1 applied from the n+1$^{th}$ stage. When being turned on, the second output discharge switching element Tr32 may electrically connect the n$^{th}$ gate line GLn and the discharge power line VSL.

The inverting unit INV of the n$^{th}$ non-display driving unit NDn may charge and discharge the reset node Qb of the n$^{th}$ stage STn based on a first control signal and a second control signal externally applied thereto. The inverting unit INV of the n$^{th}$ non-display driving unit NDn may include a first inverting switching element Tr41 and a second inverting switching element Tr42.

The first inverting switching element Tr41 of the n$^{th}$ non-display driving unit NDn may charge the reset node Qb of the n$^{th}$ stage STn based on the first control signal. The first control signal may be the first clock signal CLK1 applied from the first clock line CL11 in the non-display area AR2. The first inverting switching element Tr41 of the n$^{th}$ non-display driving unit NDn may be turned on or turned off based on the first clock signal CLK1. When being turned on, the first inverting switching element Tr41 may electrically connect the first clock line CL11 in the non-display area AR2 and the reset node Qb of the $n^{th}$ stage STn.

The second inverting switching element Tr42 of the $n^{th}$ non-display driving unit NDn may discharge the reset node Qb of the $n^{th}$ stage STn based on the second control signal. The second control signal may be a signal applied to the set node Q of the $n^{th}$ stage STn. The second inverting switching element Tr42 of the $n^{th}$ non-display driving unit NDn may be turned on or turned off based on the signal applied to the set node Q of the $n^{th}$ stage STn. When being turned on, the second inverting switching element Tr42 may electrically connect the reset node Qb of the $n^{th}$ stage STn and the discharge power line VSL.

The holding switching element Tr55 of the $n^{th}$ non-display driving unit NDn may discharge the set node Q of the $n^{th}$ stage STn based on the signal applied to the reset node Qb of the $n^{th}$ stage STn. The holding switching element Tr55 of the $n^{th}$ non-display driving unit NDn may be turned on or turned off based on the signal applied to the reset node Qb of the $n^{th}$ stage STn. When being turned on, the holding switching element Tr55 may electrically connect the set node Q of the $n^{th}$ stage STn and the discharge power line VSL.

The reset switching element Tr66 of the $n^{th}$ non-display driving unit NDn may discharge the set node Q of the $n^{th}$ stage STn based on a reset control signal externally applied thereto. The reset control signal may be the $n+1^{th}$ gate signal GSn+1 applied from the $n+1^{th}$ stage. The reset switching element Tr66 of the $n^{th}$ non-display driving unit NDn may be turned on or turned off based on the $n+1^{th}$ gate signal GSn+1 applied from the $n+1^{th}$ stage. When being turned on, the reset switching element Tr66 may electrically connect the set node Q of the $n^{th}$ stage STn and the discharge power line VSL.

The capacitor C11 of the $n^{th}$ non-display driving unit NDn may be connected between the set node Q of the $n^{th}$ stage STn and the $n^{th}$ gate line GLn. In this regard, the capacitor C11 may be substituted with a parasitic capacitor between a gate electrode and a drain electrode of the output switching element Tr22. The drain electrode of the output switching element Tr22 may correspond to the output terminal OT11 of the $n^{th}$ non-display driving unit NDn.

At least one of the set node Q and the reset node Qb of the $n^{th}$ stage STn may be disposed in at least one of the $n^{th}$ non-display driving unit NDn and the $n^{th}$ display driving unit DDn.

Although not illustrated, other display driving units connected to the $n^{th}$ gate line GLn in common may have the same configuration as that of the $n^{th}$ display driving unit DDn illustrated in FIG. 6. In such an exemplary embodiment, a set switching element and an output switching element of each of the aforementioned other display driving units may be connected to the set node Q in common. In addition, the output switching elements of the respective aforementioned other display driving units may be connected to the $n^{th}$ gate line GLn in common.

In general, the output switching element is connected to a gate line having a great line load, and thus needs a greater current driving capability than that of other switching elements. To this end, the output switching element has a greater channel than that of other switching elements. In addition, the set switching element needs to apply a voltage that may substantially turn on such an output switching element to the set node Q, and thus have a greater channel than that of other switching elements.

According to the configuration illustrated in FIG. 6, since the output switching elements Tr2 and Tr22 and the set switching elements Tr1 and Tr11 are distributed into the display area AR1 and the non-display area AR2, a channel of the output switching element Tr22 in the non-display area AR2 and a channel of the set switching element Tr11 in the non-display area AR2 may be reduced in size. Accordingly, sizes of the output switching element Tr22 and the set switching element Tr11 in the non-display area AR2 may be reduced. In a case where occupying areas of the output switching element Tr22 and the set switching element Tr11 in the non-display area AR2 are reduced in such a manner, an area of the non-display area AR2 may be reduced, and accordingly, an area of a bezel portion of a display device may be reduced. While individual current driving capabilities of the respective output switching elements are degraded in accordance with the reduction in the channels of the respective output switching elements, the output switching elements are connected to a single gate line in parallel to operate the gate line simultaneously, such that the gate line may be normally charged.

The capacitors C11 and C1 may also be distributed into the display area AR1 and the non-display area AR2, and accordingly, the size of the bezel portion may be reduced.

In a case where three or more output switching elements and three or more set switching elements, although not illustrated, are distributed into the display area AR1 and the non-display area AR2, the output switching elements and the set switching elements may each further be reduced in size.

In FIG. 6, at least one of several switching elements included in the display driving unit DDn may be disposed in the non-display driving unit NDn rather than in the display driving unit DDn, and at least one of several switching elements included in the non-display driving unit NDn may be disposed in the display driving unit DDn rather than in the non-display driving unit NDn.

Hereinafter, operation of the $n^{th}$ stage STn will be described in detail with reference to FIGS. 4 and 6.

1) Set Period (Ts)

As illustrated in FIG. 4 and FIG. 6, the $n-1^{th}$ gate signal GSn−1 has a voltage of a high level, and is output from the $n-1^{th}$ stage at a set period Ts of the $n^{th}$ stage STn. The $n-1^{th}$ gate signal GSn−1 may then be applied to a gate electrode of the set switching element Tr1 provided in the $n^{th}$ display driving unit DDn and a gate electrode of the set switching element Tr11 provided in the $n^{th}$ non-display driving unit NDn. The set switching element Tr1 of the $n^{th}$ display driving unit DDn and the set switching element Tr11 of the $n^{th}$ non-display driving unit NDn may then be turned on, and through the turned-on set switching elements Tr1 and Tr11, the $n-1^{th}$ gate signal GSn−1, having a high voltage level, may be applied to the set node Q of the $n^{th}$ stage STn. Accordingly, the set node Q is charged, and the output switching element Tr2 of the $n^{th}$ display driving unit DDn, the output switching element Tr22 of the $n^{th}$ non-display driving unit NDn, and the second inverting switching element Tr42 connected to the charged set node Q through respective gate electrodes thereof, may be turned on. As illustrated in FIG. 4, the first clock signal CLK1 may maintain a low voltage in the set period Ts, and the first inverting switching element Tr41 receiving the first clock signal CLK1 with the low voltage through a gate electrode thereof, is turned off.

The discharge voltage VSS may be applied to the reset node Qb of the $n^{th}$ stage STn through the turned-on second inverting switching element Tr42. Accordingly, the reset node Qb may be discharged, and the holding switching element Tr55 and the first output discharge switching element Tr31 connected to the discharged reset node Qb through respective gate electrodes thereof may be turned off. As illustrated in FIG. 4, since the n+1$^{th}$ gate signal GSn+1 applied from the n+1$^{th}$ stage may maintain a low voltage in the set period Ts, the reset switching element Tr66 and the second output discharge switching element Tr32 receiving the n+1$^{th}$ gate signal GSn+1 having the low voltage through respective gate electrodes thereof may be turned off.

As such, while the set node Q may be charged with a high voltage in the set period Ts of the n$^{th}$ stage STn, the reset node Qb may be discharged to a low voltage state, and the n$^{th}$ stage STn may be set.

2) Output Period (To)

As the n−1$^{th}$ gate signal GSn−1 transitions to a voltage of a low level in the output period To of the n$^{th}$ stage STn, as illustrated in FIG. 4, the set switching element Tr1 of the n$^{th}$ display driving unit DDn and the set switching element Tr11 of the n$^{th}$ non-display driving unit NDn may be turned off. During the output period To, the set node Q of the n$^{th}$ stage STn may fall into a floating state. As the set node Q maintains a charged state due to the high voltage applied thereto in the aforementioned set period Ts, the output switching element Tr2 of the n$^{th}$ display driving unit DDn, the output switching element Tr22, and the second inverting switching element Tr42 of the n$^{th}$ non-display driving unit NDn connected to the set node Q through respective gate electrodes thereof may maintain a turned-on state.

In the output period To, the first clock signal CLK1 has a high voltage and may be applied to each of the output switching elements Tr2 and Tr22 that are in the turned-on state. In such an exemplary embodiment, due to coupling phenomena of respective parasitic capacitors, for example, capacitors C1 and C11, formed in the respective output switching elements Tr2 and Tr22, a signal of the set node Q may be bootstrapped when the first clock signal CLK1 is applied to each of the output switching elements Tr2 and Tr22. Accordingly, each of the output switching elements Tr2 and Tr22 that are turned on may substantially output the first clock signal CLK1 as the n$^{th}$ gate signal GSn without loss.

The n$^{th}$ gate signal GSn output from the output switching element Tr2 of the n$^{th}$ display driving unit DDn may be applied to the n$^{th}$ gate line GLn through the output terminal OT1 of the n$^{th}$ display driving unit DDn, and the n$^{th}$ gate signal GSn output from the output switching element Tr22 of the n$^{th}$ non-display driving unit NDn may be applied to the n$^{th}$ gate line GLn through the output terminal OT11 of the n$^{th}$ non-display driving unit NDn.

The n$^{th}$ gate signal GSn applied from the n$^{th}$ display driving unit DDn may further be applied to at least one of the display driving unit of the n+1$^{th}$ stage and the non-display driving unit of the n+1$^{th}$ stage. For example, the n$^{th}$ gate signal GSn applied from the n$^{th}$ display driving unit DDn may further be applied to at least one of the set switching element provided in the display driving unit of the n+1$^{th}$ stage and the set switching element provided in the non-display driving unit of the n+1$^{th}$ stage. In such an exemplary embodiment, the n$^{th}$ gate signal GSn may be applied to a gate electrode and a drain electrode of each of the set switching elements provided in the n+1$^{th}$ stage. The display driving unit and the non-display driving unit of the n+1$^{th}$ stage may be set by the n$^{th}$ gate signal GSn.

The n$^{th}$ gate signal GSn applied from the n$^{th}$ display driving unit DDn may further be applied to the non-display driving unit of the n−1$^{th}$ stage. For example, the n$^{th}$ gate signal GSn applied from the n$^{th}$ display driving unit DDn may further be applied to the reset switching element and the second output discharge switching element provided in the non-display driving unit of the n−1$^{th}$ stage. In such an exemplary embodiment, the n$^{th}$ gate signal GSn may be applied to a gate electrode of the reset switching element in the n−1$^{th}$ stage and a gate electrode of the second output discharge switching element in the n−1$^{th}$ stage. The non-display driving unit of the n−1$^{th}$ stage may be reset by the n$^{th}$ gate signal GSn.

The n$^{th}$ gate signal GSn applied from the n$^{th}$ non-display driving unit NDn may further be applied to at least one of the display driving unit of the n+1$^{th}$ stage and the non-display driving unit of the n+1$^{th}$ stage. For example, the n$^{th}$ gate signal GSn applied from the n$^{th}$ non-display driving unit NDn may further be applied to at least one of the set switching element provided in the display driving unit of the n+1$^{th}$ stage and the set switching element provided in the non-display driving unit of the n+1$^{th}$ stage. In such an exemplary embodiment, the n$^{th}$ gate signal GSn may be applied to the gate electrode and the drain electrode of each of the set switching elements. The display driving unit and the non-display driving unit of the n+1$^{th}$ stage may be set by the n$^{th}$ gate signal GSn.

3) Reset Period (Trs)

As illustrated in FIG. 4, the n+1$^{th}$ gate signal GSn+1 having a voltage of a high level may be output from the n+1$^{th}$ stage in the reset period Trs of the n$^{th}$ stage STn, and the n+1$^{th}$ gate signal GSn+1 having the voltage of a high level is applied to the gate electrode of the reset switching element Tr66 in the n$^{th}$ non-display driving unit NDn and the gate electrode of the second output discharge switching element Tr32 in the n$^{th}$ non-display driving unit NDn. As such, the reset switching element Tr66 and the second output discharge switching element Tr32 may be turned on.

Through the turned-on second output discharge switching element Tr32, the discharge voltage VSS applied from the discharge power line VSL may be applied to the n$^{th}$ gate line GLn, and the n$^{th}$ gate line GLn may be discharged.

Through the turned-on reset switching element Tr66, the discharge voltage VSS may be applied from the discharge power line VSL to the set node Q of the n$^{th}$ stage STn. In such an exemplary embodiment, the set node Q may be discharged, and the output switching element Tr22 of the n$^{th}$ non-display driving unit NDn, the second inverting switching element Tr42 of the n$^{th}$ non-display driving unit NDn, and the output switching element Tr2 of the n$^{th}$ display driving unit DDn that are connected to the discharged set node Q through the gate electrodes thereof may be turned off.

In the reset period Trs of the n$^{th}$ stage STn, the set node Q is discharged to a voltage of a low level, the reset node Qb is charged with a voltage of a high level, and the n$^{th}$ stage STn may be reset.

In a period T subsequent to the reset period Ts, as illustrated in FIG. 4, the first clock signal CLK1 having a voltage of a high level may be applied to the gate electrode and a drain electrode of the first inverting switching element Tr41. Accordingly, the first inverting switching element Tr41 may be turned on.

The first clock signal CLK1 having a voltage of a high level may be applied to the reset node Qb of the n$^{th}$ stage STn through the turned-on first inverting switching element Tr41. Accordingly, the reset node Qb may be charged with a voltage of a high level, and the holding switching element Tr55 and the first output discharge switching element Tr31 connected to the charged reset node Qb through respective gate electrodes thereof may be turned on.

The discharge voltage VSS applied from the discharge power line VSL may be applied to the set node Q through the turned-on holding switching element Tr55. Accordingly, the set node Q may be discharged.

The discharge voltage VSS applied from the discharge power line VSL may be applied to the $n^{th}$ gate line GLn through the turned-on first output discharge switching element Tr31. Accordingly, the $n^{th}$ gate line GLn may be discharged.

The first clock signal CLK1 periodically has a voltage of a high level. Each time the first clock signal CLK1 has a voltage of a high level, the first inverting switching element Tr41 of the $n^{th}$ stage STn, which may be reset, may be turned on such that the reset node Qb may be charged by the first clock signal CLK1. Each time the reset node Qb is charged, the holding switching element Tr55 and the first output discharge switching element Tr31 may be turned on, such that the set node Q and the $n^{th}$ gate line GLn may be stabilized with the discharge voltage VSS. Accordingly, the reset node Qb of the $n^{th}$ stage STn which may be reset and the $n^{th}$ gate line GLn may be periodically discharged based on the first clock signal CLK1 until the $n^{th}$ stage STn is set again.

Figure 7:
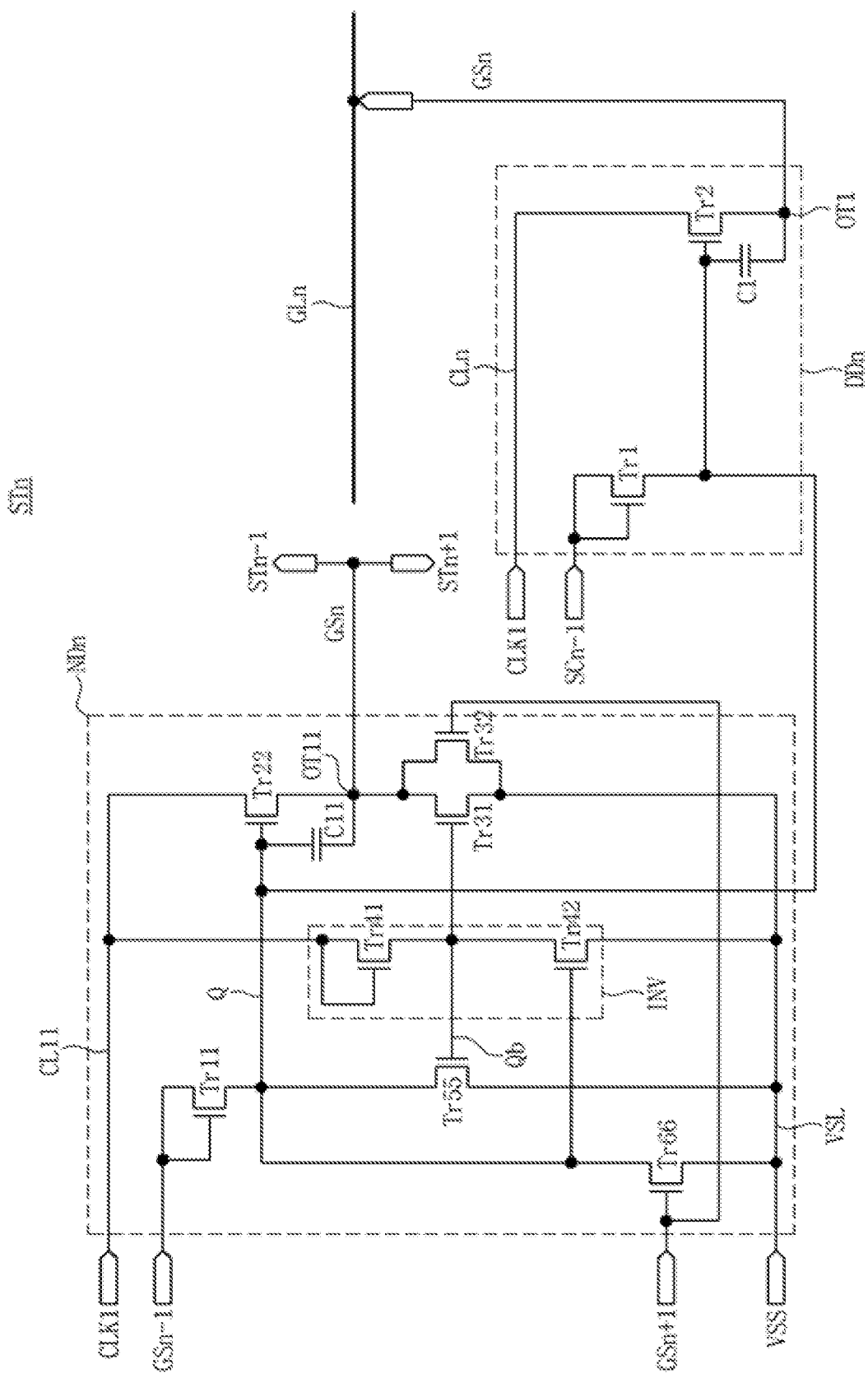
FIG. 7 is a detailed configuration view illustrating the $n^{th}$ stage of FIG. 5 according to an exemplary embodiment.

FIG. 7 is a detailed configuration view illustrating the $n^{th}$ stage STn of FIG. 5 according to an exemplary embodiment.

A display driving unit DDn of the $n^{th}$ stage STn (hereinafter, "$n^{th}$ display driving unit DDn"), as illustrated in FIG. 7, may include a set switching element Tr1, an output switching element Tr2, and a capacitor C1.

The set switching element Tr1, the output switching element Tr2, and the capacitor C1 of the $n^{th}$ display driving unit DDn illustrated in FIG. 7 are substantially the same as those illustrated in FIG. 6, and thus descriptions with regard thereto will make reference to FIG. 6 and the related descriptions thereof.

A non-display driving unit NDn of the $n^{th}$ stage STn (hereinafter, "$n^{th}$ non-display driving unit NDn"), as illustrated in FIG. 7, may include a set switching element Tr11, an output switching element Tr22, a first output discharge switching element Tr31, a second output discharge switching element Tr32, an inverting unit INV, a holding switching element Tr55, a reset switching element Tr66, and a capacitor C11.

The set switching element Tr11, the inverting unit INV, the holding switching element Tr55, and the reset switching element Tr66 of the $n^{th}$ non-display driving unit NDn illustrated in FIG. 7 are substantially the same as those illustrated in FIG. 6, and thus descriptions with regard thereto will make reference to FIG. 6 and the related descriptions thereof.

The output switching element Tr22 of the $n^{th}$ non-display driving unit NDn illustrated in FIG. 7 may apply a gate signal to the $n+1^{th}$ stage and the $n-1^{th}$ stage based on a signal applied to a set node Q of the $n^{th}$ stage STn. The output switching element Tr22 of the $n^{th}$ non-display driving unit NDn may output the first clock signal CLK1 as an $n^{th}$ gate signal GSn. The output switching element Tr22 of the $n^{th}$ non-display driving unit NDn may be turned on or turned off based on the signal applied to the set node Q of the $n^{th}$ stage STn, and when being turned on, the output switching element Tr22 may electrically connect the first clock line CL11 in the non-display area AR2, the $n+1^{th}$ stage, and the $n-1^{th}$ stage to each other. In such an exemplary embodiment, the output switching element Tr22 may be connected to the $n+1^{th}$ stage and the $n-1^{th}$ stage through an output terminal OT11 of the $n^{th}$ non-display driving unit NDn.

The first output discharge switching element Tr31 of the $n^{th}$ non-display driving unit NDn illustrated in FIG. 7 may discharge the output terminal OT11 of the $n^{th}$ non-display driving unit NDn based on a signal applied to a reset node Qb of the $n^{th}$ stage STn. The first output discharge switching element Tr31 of the $n^{th}$ non-display driving unit NDn may be turned on or turned off based on the signal of the reset node Qb of the $n^{th}$ stage STn, and when being turned on, the first output discharge switching element Tr31 may electrically connect the output terminal OT11 of the $n^{th}$ non-display driving unit NDn and a discharge power line VSL.

The second output discharge switching element Tr32 of the $n^{th}$ non-display driving unit NDn illustrated in FIG. 7 may discharge the output terminal OT11 of the $n^{th}$ non-display driving unit NDn based on a reset control signal externally applied thereto. The reset control signal may be an $n+1^{th}$ gate signal GSn+1 applied from the $n+1^{th}$ stage. The second output discharge switching element Tr32 of the $n^{th}$ non-display driving unit NDn may be turned on or turned off based on the $n+1^{th}$ gate signal GSn+1 applied from the $n+1^{th}$ stage, and when being turned on, the second output discharge switching element Tr32 may electrically connect the output terminal OT11 of the $n^{th}$ non-display driving unit NDn and the discharge power line VSL.

The capacitor C11 of the $n^{th}$ non-display driving unit NDn illustrated in FIG. 7 may be connected between the set node Q of the $n^{th}$ stage STn and the output terminal OT11 of the $n^{th}$ non-display driving unit NDn. The capacitor C11 may be substituted with a parasitic capacitor between a gate electrode and a drain electrode of the output switching element Tr22. Herein, the drain electrode of the output switching element Tr22 corresponds to the output terminal OT11 of the $n^{th}$ non-display driving unit NDn.

Although not illustrated, other display driving units connected to the $n^{th}$ gate line GLn in common may have the same configuration as that of the $n^{th}$ display driving unit DDn of FIG. 7. In such an exemplary embodiment, a set switching element and an output switching element of each of the aforementioned other display driving units may be connected to the set node Q of the $n^{th}$ non-display driving unit NDn in common. In addition, the respective output switching elements of the aforementioned other display driving units may be connected to the $n^{th}$ gate line GLn in common.

Referring to FIG. 7, the $n^{th}$ display driving unit DDn may be connected to the $n^{th}$ gate line GLn, while the $n^{th}$ non-display driving unit NDn may not be connected to the $n^{th}$ gate line GLn. In such an exemplary embodiment, a load of the output switching element Tr22 provided in the $n^{th}$ non-display driving unit NDn may decrease, such that the output switching element Tr22 may have a smaller-sized channel. Further, the set switching element Tr11 for charging the set node Q of the $n^{th}$ stage STn may also have a smaller-sized channel. Accordingly, sizes of the output switching element Tr22 and the set switching element Tr11 in the non-display area AR2 may be reduced. In a case where the occupying areas of the output switching element Tr22 and the set switching element Tr11 in the non-display area AR2 are reduced in such a manner, an area of the non-display area AR2 may be reduced, and an area of a bezel portion of a display device may be reduced.

Although not illustrated, in a case where three or more output switching elements and three or more set switching elements are distributed into the display area AR1 and the non-display area AR2, each of the output switching elements and the set switching elements may be reduced in size.

In FIG. 7, at least one of several switching elements included in the display driving unit DDn may be disposed in the non-display driving unit NDn rather than in the display driving unit DDn, and at least one of several switching elements included in the non-display driving unit NDn may be disposed in the display driving unit DDn rather than in the non-display driving unit NDn.

Figure 8:
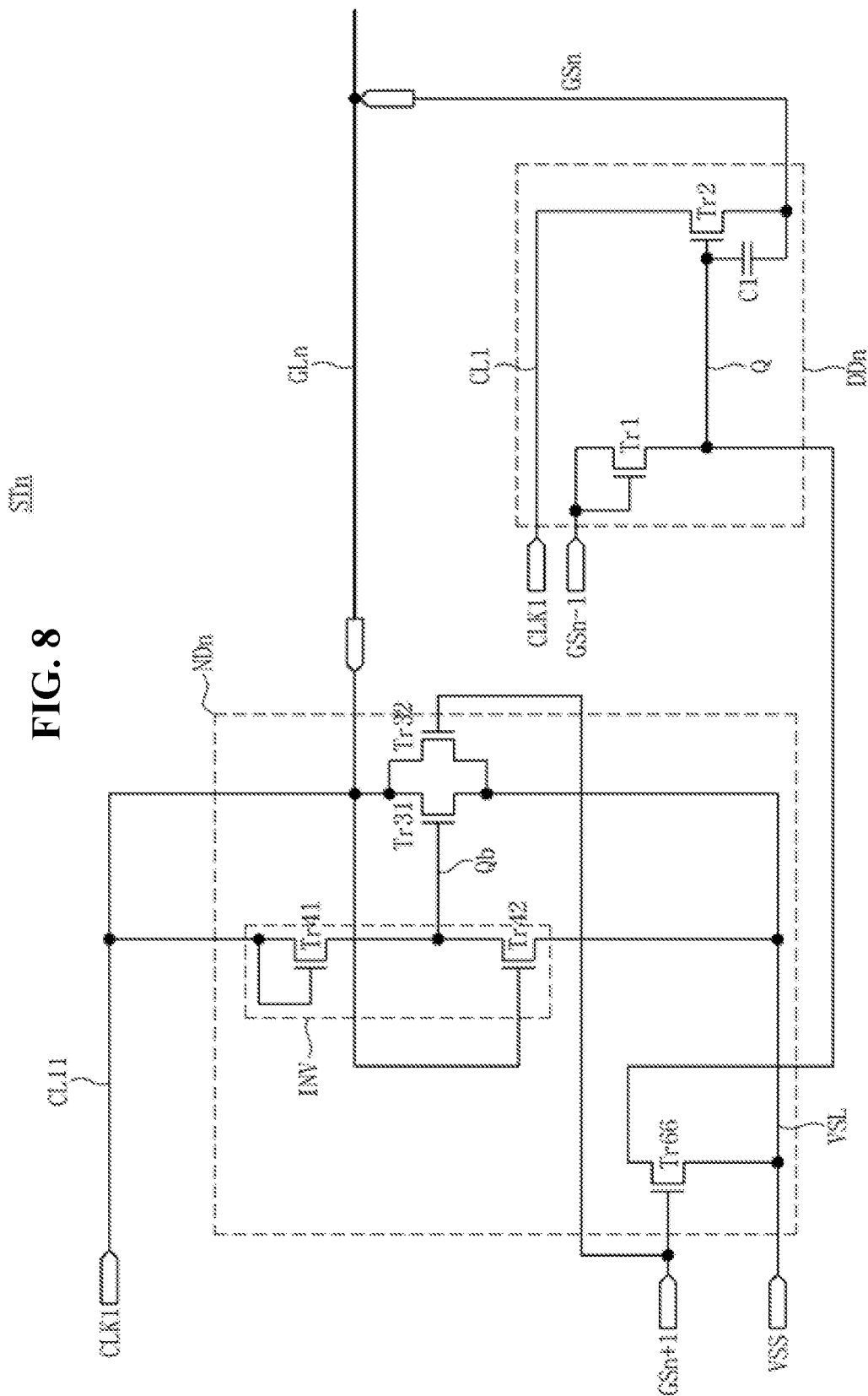
FIG. 8 is a detailed configuration view illustrating the $n^{th}$ stage of FIG. 5 according to an exemplary embodiment.

FIG. 8 is a detailed configuration view illustrating the $n^{th}$ stage STn of FIG. 5 according to an exemplary embodiment.

A display driving unit DDn of the $n^{th}$ stage STn (hereinafter, "$n^{th}$ display driving unit DDn"), as illustrated in FIG. 8, may include a set switching element Tr1, an output switching element Tr2, and a capacitor C1.

The set switching element Tr1, the output switching element Tr2, and the capacitor C1 of the $n^{th}$ display driving unit DDn illustrated in FIG. 8 are substantially the same as those illustrated in FIG. 6, and thus descriptions with regard thereto will make reference to FIG. 6 and the related descriptions thereof.

A non-display driving unit NDn of the $n^{th}$ stage STn (hereinafter, "$n^{th}$ non-display driving unit NDn"), as illustrated in FIG. 8, may include a first output discharge switching element Tr31, a second output discharge switching element Tr32, an inverting unit INV, and a reset switching element Tr66.

The first output discharge switching element Tr31, the second output discharge switching element Tr32, a first inverting switching element Tr41, and a reset switching element Tr66 of the $n^{th}$ non-display driving unit NDn illustrated in FIG. 8 are substantially the same as those illustrated in FIG. 6, and thus descriptions with regard thereto will make reference to FIG. 6 and the related descriptions thereof.

The second inverting switching element Tr42 of the $n^{th}$ non-display driving unit NDn illustrated in FIG. 8 may discharge a reset node Qb of the $n^{th}$ stage STn based on a second control signal. The second control signal may be a signal applied to an $n^{th}$ gate line GLn. The second inverting switching element Tr42 of the $n^{th}$ non-display driving unit NDn may be turned on or turned off based on a gate signal applied from the $n^{th}$ gate line GLn, and when being turned on, the second inverting switching element Tr42 may electrically connect the reset node Qb of the $n^{th}$ stage STn and a discharge power line VSL.

The reset switching element Tr66 illustrated in FIG. 8 may be disposed in the $n^{th}$ display driving unit DDn rather than in the $n^{th}$ non-display driving unit NDn.

Although not illustrated, other display driving units connected to the $n^{th}$ gate line GLn in common may have the same configuration as that of the $n^{th}$ display driving unit DDn of FIG. 8. In this regard, a set switching element and an output switching element of each of the aforementioned other display driving units may be connected to the reset switching element Tr66 in common through a set node Q. In addition, the respective output switching elements of the aforementioned other display driving units may be connected to the $n^{th}$ gate line GLn in common.

With reference to FIG. 8, the output switching element Tr2 and the set switching element Tr1 having larger channels than those of other switching elements may be disposed in the display area AR1, and other switching elements may be disposed in the non-display area AR2. Accordingly, an area of a bezel portion of a display device may be reduced in size.

although not illustrated, in a case where three or more output switching elements and three or more set switching elements are distributed into the display area AR1 and the non-display area AR2, each of the output switching elements and the set switching elements may be reduced in size.

In FIG. 8, at least one of several switching elements included in the display driving unit DDn may be disposed in the non-display driving unit NDn rather than in the display driving unit DDn, and at least one of several switching elements included in the non-display driving unit NDn may be disposed in the display driving unit DDn rather than in the non-display driving unit NDn.

Figure 9:
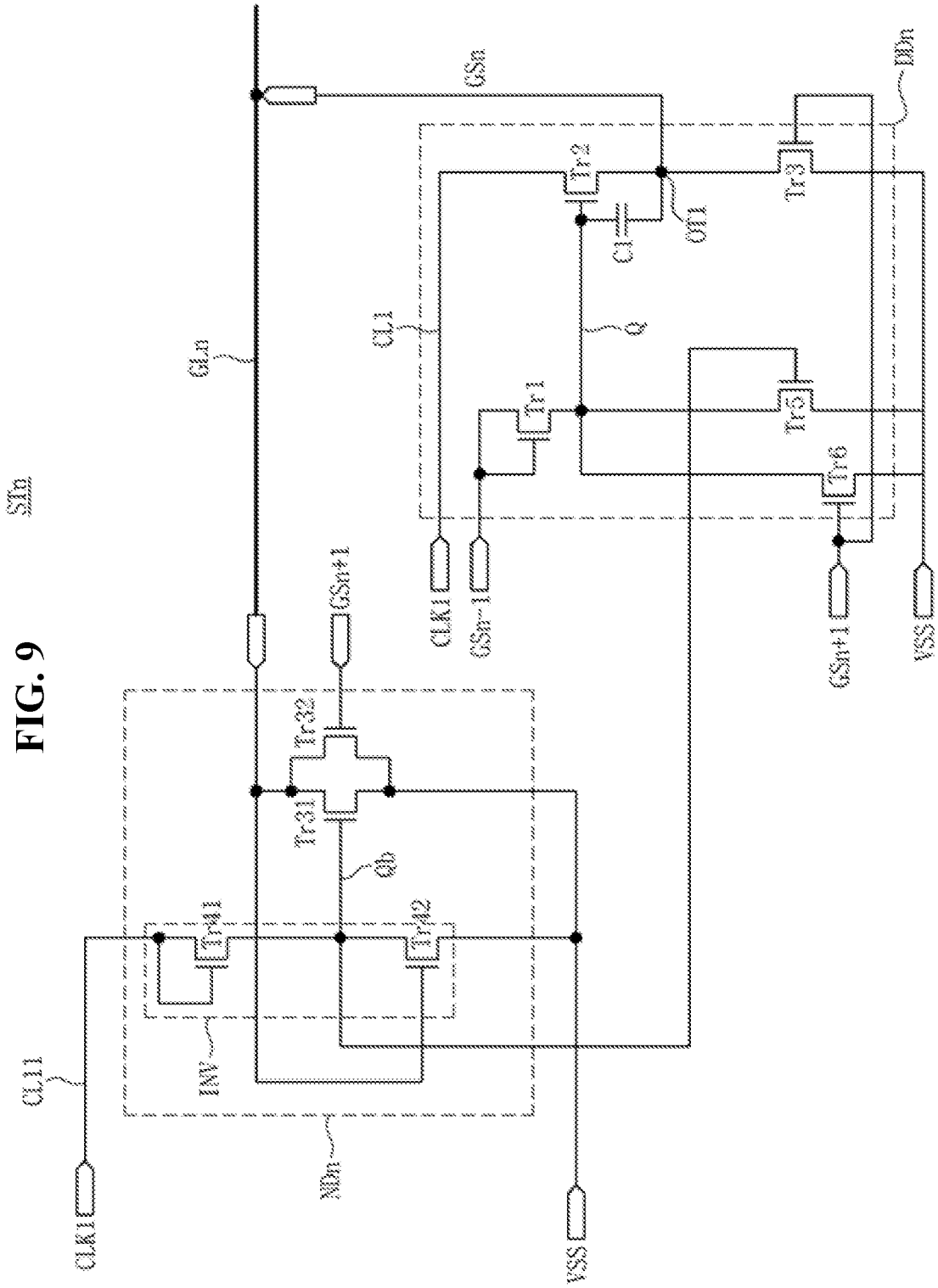
FIG. 9 is a detailed configuration view illustrating the $n^{th}$ stage of FIG. 5 according to an exemplary embodiment.

FIG. 9 is a detailed configuration view illustrating the $n^{th}$ stage STn of FIG. 5.

A display driving unit DDn of the $n^{th}$ stage STn (hereinafter, "$n^{th}$ display driving unit DDn"), as illustrated in FIG. 9, may include a set switching element Tr1, an output switching element Tr2, an output discharge switching element Tr3, a holding switching element Tr5, a reset switching element Tr6, and a capacitor C1.

The set switching element Tr1, the output switching element Tr2, the output discharge switching element Tr3, the holding switching element Tr5, the reset switching element Tr6, and the capacitor C1 of the $n^{th}$ display driving unit DDn illustrated in FIG. 9 are substantially the same as the set switching element Tr11, the output switching element Tr22, the second output discharge switching element Tr32, the holding switching element Tr55, the reset switching element Tr66, and the capacitor C11 of the $n^{th}$ non-display driving unit NDn illustrated in FIG. 6, and thus descriptions with regard thereto will make reference to FIG. 6 and the related descriptions.

A non-display driving unit NDn of the $n^{th}$ stage STn (hereinafter, "$n^{th}$ non-display driving unit NDn"), as illustrated in FIG. 9, may include a first output discharge switching element Tr31, a second output discharge switching element Tr32, an inverting unit INV, and a reset switching element Tr6.

The first output discharge switching element Tr31, the second output discharge switching element Tr32, and the inverting unit INV illustrated in FIG. 9 are substantially the same as those illustrated in FIG. 6, and thus descriptions with regard thereto will make reference to FIG. 6 and the related descriptions thereof.

An $n+1^{th}$ gate signal GSn+1 applied to the reset switching element Tr6 of FIG. 9 may be at least one of an $n+1^{th}$ gate signal GSn+1 output from a display driving unit of the $n+1^{th}$ stage and an $n+1^{th}$ gate signal GSn+1 output from a non-display driving unit of the $n+1^{th}$ stage.

In FIG. 9, an $n+1^{th}$ gate signal GSn+1 applied to the second output discharge switching element Tr32 of the $n^{th}$ non-display driving unit NDn may be at least one of the $n+1^{th}$ gate signal GSn+1 output from the display driving unit of the $n+1^{th}$ stage and the $n+1^{th}$ gate signal GSn+1 output from the non-display driving unit of the $n+1^{th}$ stage.

An $n+1^{th}$ gate signal GSn+1 applied to the output discharge switching element Tr3 of the $n^{th}$ display driving unit DDn may be at least one of the $n+1^{th}$ gate signal GSn+1 output from the display driving unit of the $n+1^{th}$ stage and the $n+1^{th}$ gate signal GSn+1 output from the non-display driving unit of the $n+1^{th}$ stage.

Although not illustrated, other display driving units connected to the $n^{th}$ gate line GLn in common may have the same configuration as that of the $n^{th}$ display driving unit DDn of FIG. 9. In such an exemplary embodiment, holding switching elements of the respective aforementioned other display driving units may be connected to the reset node Qb in common. In addition, output switching elements of the respective aforementioned other display driving units may be connected to the $n^{th}$ gate line GLn in common.

With reference to FIG. 9, the output switching element Tr2 and the set switching element Tr1 having larger channels than those of other switching elements may be disposed in the display area AR1, and several other switching elements Tr3, Tr5, and Tr6 and the capacitor C1 may be further disposed in the display area AR1. The other switching elements except for the aforementioned switching elements Tr3, Tr5, and Tr6 may be disposed in the non-display area AR2. Accordingly, an area of a bezel portion of a display device may be reduced.

Although not illustrated, in a case where three or more output switching elements and three or more set switching elements are distributed into the display area AR1 and the non-display area AR2, each of the output switching elements and the set switching elements may be reduced in size.

In FIG. 9, at least one of several switching elements included in the display driving unit DDn may be disposed in the non-display driving unit NDn rather than in the display driving unit DDn, and at least one of several switching elements included in the non-display driving unit NDn may be disposed in the display driving unit DDn rather than in the non-display driving unit NDn.

Figure 10:
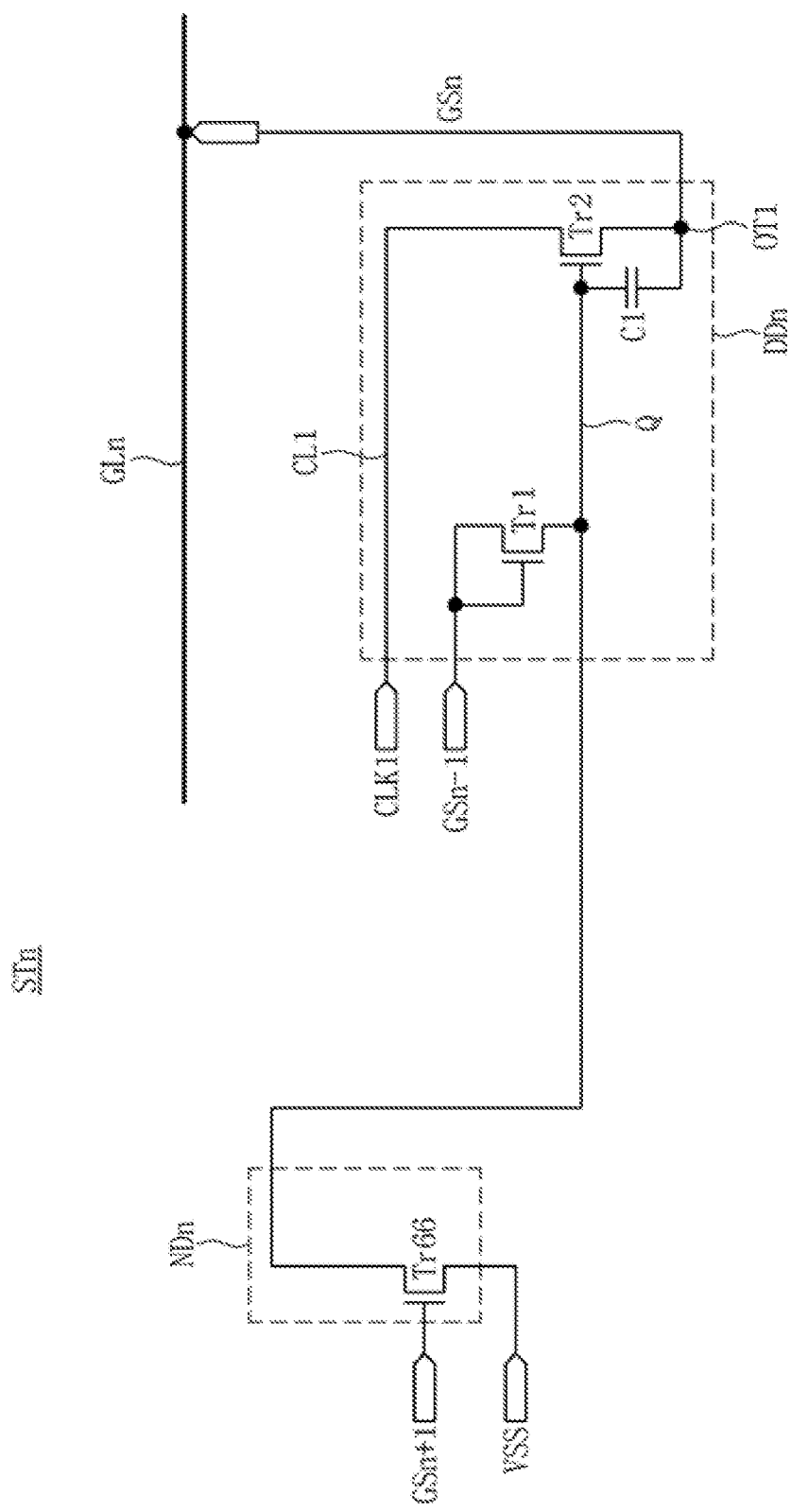
FIG. 10 is a detailed configuration view illustrating the $n^{th}$ stage of FIG. 5 according to an exemplary embodiment.

FIG. 10 is a detailed configuration view illustrating the $n^{th}$ stage STn of FIG. 5 according to an exemplary embodiment.

A display driving unit DDn of the $n^{th}$ stage STn (hereinafter, "$n^{th}$ display driving unit DDn"), as illustrated in FIG. 10, may include a set switching element Tr1, an output switching element Tr2, and a capacitor C1.

The set switching element Tr1, the output switching element Tr2, and the capacitor C1 of the $n^{th}$ display driving unit DDn illustrated in FIG. 10 are substantially the same as those of the $n^{th}$ display driving unit DDn illustrated in FIG. 6, and thus descriptions with regard thereto will make reference to FIG. 6 and the related descriptions thereof.

A non-display driving unit NDn of the $n^{th}$ stage STn (hereinafter, "$n^{th}$ non-display driving unit NDn"), as illustrated in FIG. 10, may include a reset switching element Tr66.

The reset switching element Tr66 of the $n^{th}$ non-display driving unit NDn illustrated in FIG. 10 is substantially the same as that of the $n^{th}$ non-display driving unit NDn illustrated in FIG. 6, and thus descriptions with regard thereto will make reference to FIG. 6 and the related descriptions thereof.

Although not illustrated, other display driving units connected to the $n^{th}$ gate line GLn in common may have the same configuration as that of the $n^{th}$ display driving unit DDn of FIG. 10. In this regard, a set switching element and an output switching element of each of the aforementioned other display driving units may be connected to the set node Q in common. In addition, output switching elements of the respective aforementioned other display driving units may be connected to the $n^{th}$ gate line GLn in common.

With reference to FIG. 10, the output switching element Tr2 and the set switching element Tr1 having greater channels than those of other switching elements may be disposed in the display area AR1, and the capacitor C1 may be further disposed in the display area AR1. Other switching elements except for the aforementioned switching elements (e.g., the output switching element Tr2 and the set switching element Tr1) may be disposed in the non-display area AR2. Accordingly, an area of a bezel portion of a display device may be reduced.

Although not illustrated, in a case where three or more output switching elements and three or more set switching elements are distributed into the display area AR1 and the non-display area AR2, each of the output switching elements and the set switching elements may be reduced in size.

In FIG. 10, at least one of several switching elements included in the display driving unit DDn may be disposed in the non-display driving unit NDn rather than in the display driving unit DDn, and at least one of several switching elements included in the non-display driving unit NDn may be disposed in the display driving unit DDn rather than in the non-display driving unit NDn.

Figure 11:
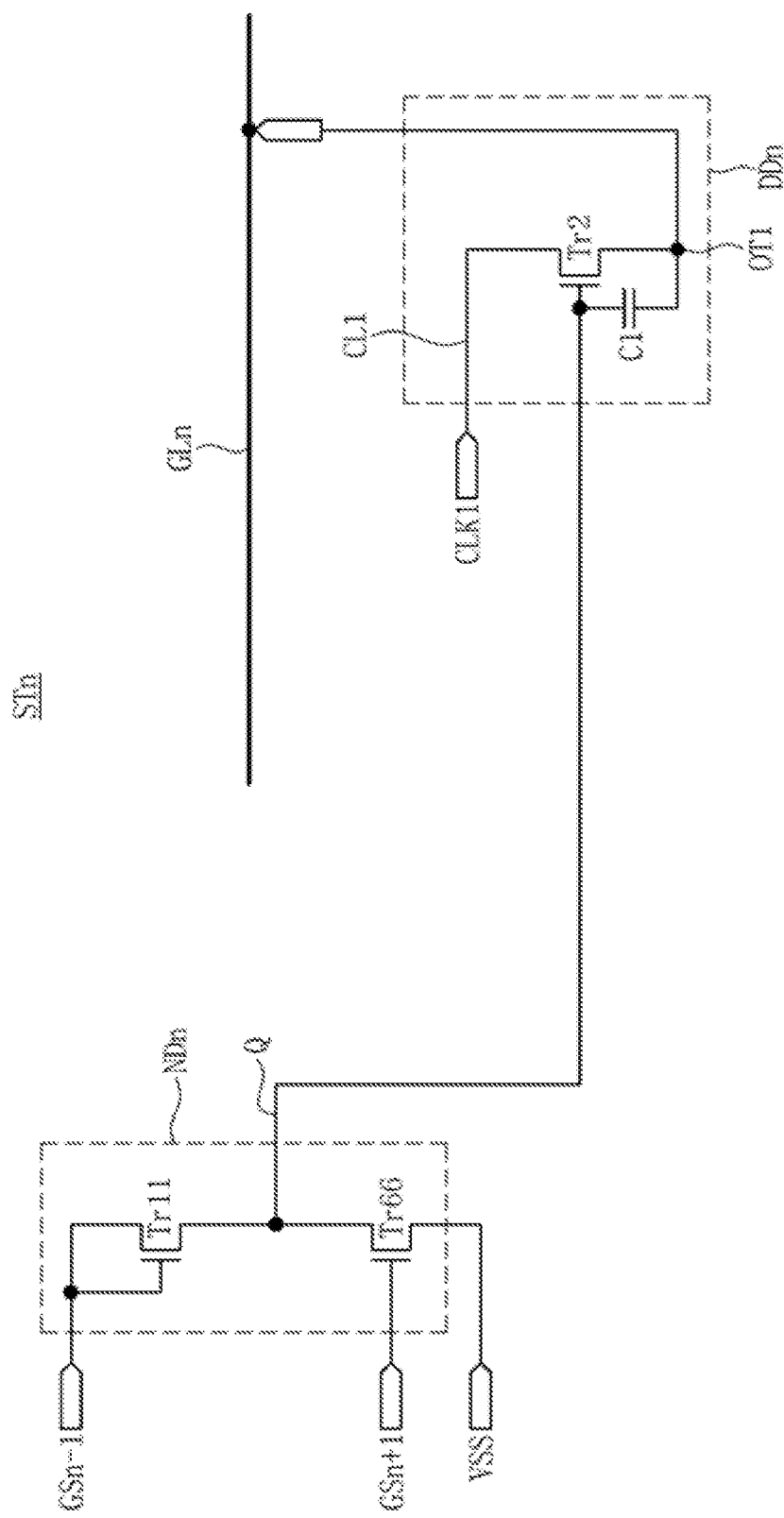
FIG. 11 is a detailed configuration view illustrating the $n^{th}$ stage of FIG. 5 according to an exemplary embodiment.

FIG. 11 is another detailed configuration view illustrating the $n^{th}$ stage STn of FIG. 5.

As illustrated in FIG. 11, a display driving unit DDn of the $n^{th}$ stage STn (hereinafter, "$n^{th}$ display driving unit DDn") may include an output switching element Tr2 and a capacitor C1.

The output switching element Tr2 and the capacitor C1 of the $n^{th}$ display driving unit DDn illustrated in FIG. 11 are substantially the same as those of the $n^{th}$ display driving unit DDn illustrated in FIG. 6, and thus descriptions with regard thereto will make reference to FIG. 6 and the related descriptions thereof.

A non-display driving unit NDn of the $n^{th}$ stage STn (hereinafter, "$n^{th}$ non-display driving unit NDn") may include a set switching element Tr11 and a reset switching element Tr66.

The set switching element Tr11 and the reset switching element Tr66 of the $n^{th}$ non-display driving unit NDn illustrated in FIG. 11 are substantially the same as those of the $n^{th}$ non-display driving unit NDn illustrated in FIG. 6, and thus descriptions with regard thereto will make reference to FIG. 6 and the related descriptions thereof.

Although not illustrated, other display driving units connected to the $n^{th}$ gate line GLn in common may have the same configuration as that of the $n^{th}$ display driving unit DDn of FIG. 11. In such an exemplary embodiment, output switching elements of the respective aforementioned other display driving units may be connected to a set node Q in common. Further, output switching elements of the respective aforementioned other display driving units may be connected to the $n^{th}$ gate line GLn in common.

With reference to FIG. 11, an output switching element having a larger channel than that of other switching elements may be disposed in the display area AR1, and the capacitor C1 may be further disposed in the display area AR1. Other switching elements (e.g., the set switching element Tr11 and the reset switching element Tr66) may be disposed in the non-display area AR2. Accordingly, an area of a bezel portion of a display device may be reduced.

Although not illustrated, in a case where three or more output switching elements and three or more set switching elements are distributed into the display area AR1 and the non-display area AR2, each of the output switching elements and the set switching elements may be reduced in size.

In FIG. 11, at least one of several switching elements included in the display driving unit DDn may be disposed in the non-display driving unit NDn rather than in the display driving unit DDn, and at least one of several switching elements included in the non-display driving unit NDn may be disposed in the display driving unit DDn rather than in the non-display driving unit NDn.

Figure 12:
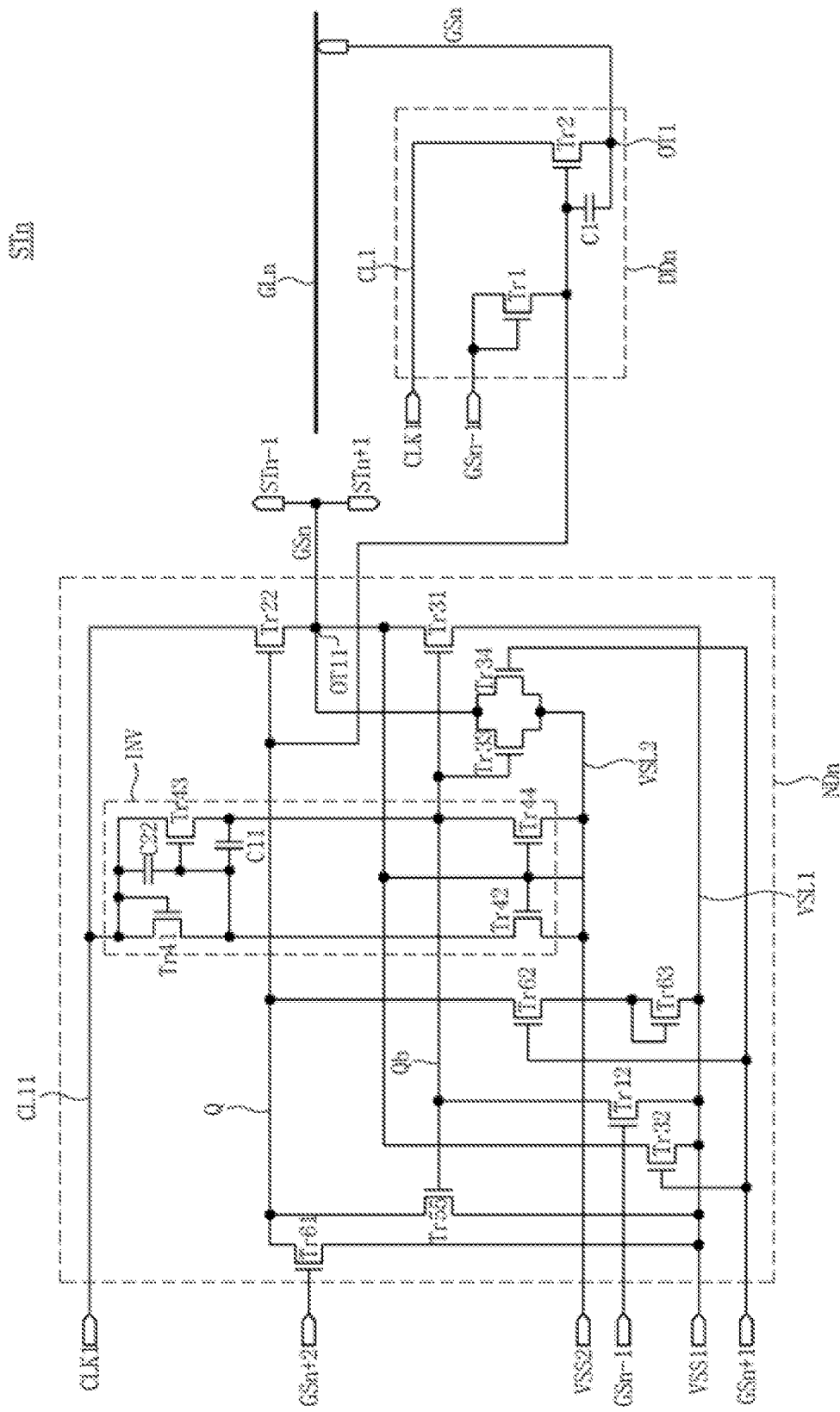
FIG. 12 is a detailed configuration view illustrating the $n^{th}$ stage of FIG. 5 according to an exemplary embodiment.

FIG. 12 is a detailed configuration view illustrating the $n^{th}$ stage STn of FIG. 5 according to an exemplary embodiment.

A display driving unit DDn of the $n^{th}$ stage STn (hereinafter, "$n^{th}$ display driving unit DDn"), as illustrated in FIG. 12, may include a set switching element Tr1, an output switching element Tr2, and a capacitor C1.

The set switching element Tr1, the output switching element Tr2, and the capacitor C1 of the $n^{th}$ display driving unit DDn illustrated in FIG. 12 are substantially the same as those of the $n^{th}$ display driving unit DDn illustrated in FIG. 6, and thus descriptions with regard thereto will make reference to FIG. 6 and the related descriptions thereof.

As illustrated in FIG. 12, a non-display driving unit NDn of the $n^{th}$ stage STn (hereinafter, "$n^{th}$ non-display driving unit NDn") may include an auxiliary set switching element Tr12, an output switching element Tr22, a first output discharge switching element Tr31, a second output discharge switching element Tr32, a third output discharge switching element Tr33, a fourth output discharge switching element Tr34, an inverting unit INV, a holding switching element Tr55, a first reset switching element Tr61, and a second reset switching element Tr62.

The output switching element Tr22, the first output discharge switching element Tr31, the second output discharge switching element Tr32, and the holding switching element Tr55 of the $n^{th}$ non-display driving unit NDn illustrated in FIG. 12 are substantially the same as those of the $n^{th}$ non-display driving unit NDn illustrated in FIG. 7, and thus descriptions with regard thereto will make reference to FIG. 7 and the related descriptions thereof. However, the first output discharge switching element Tr31 and the second output discharge switching element Tr32 of FIG. 12 may be connected to a first discharge power line VSL1 rather than the discharge power line VSL. The first discharge power line VSL1 may transmit a first discharge voltage VSS1, and the first discharge voltage VSS1 may be the same as the aforementioned discharge voltage VSS.

The auxiliary set switching element Tr12 of the $n^{th}$ non-display driving unit NDn illustrated in FIG. 12 may discharge a reset node Qb of the $n^{th}$ stage STn based on a set control signal externally applied thereto. The set control signal may be an $n-1^{th}$ gate signal GSn−1 applied from the $n-1^{th}$ stage. The auxiliary set switching element Tr12 of the $n^{th}$ non-display driving unit NDn may be turned on or turned off based on the $n-1^{th}$ gate signal GSn−1 applied from the $n-1^{th}$ stage. When being turned on, the auxiliary set switching element Tr12 may electrically connect the reset node Qb of the $n^{th}$ stage STn and the first discharge power line VSL1.

The third output discharge switching element Tr33 of the $n^{th}$ non-display driving unit NDn illustrated in FIG. 12 may discharge an output terminal OT11 of the $n^{th}$ non-display driving unit NDn based on a signal applied to the reset node Qb of the $n^{th}$ stage STn. The third output discharge switching element Tr33 of the $n^{th}$ non-display driving unit NDn may be turned on or turned off based on a signal applied to the reset node Qb of the $n^{th}$ stage STn, and when being turned on, the third output discharge switching element Tr33 may electrically connect the output terminal OT11 of the $n^{th}$ non-display driving unit NDn and a second discharge power line VSL2. The second discharge power line VSL2 may transmit a second discharge voltage VSS2. The second discharge voltage VSS2 may be smaller than the first discharge voltage VSS1.

The fourth output discharge switching element Tr34 of the $n^{th}$ non-display driving unit NDn illustrated in FIG. 12 may discharge the output terminal OT11 of the $n^{th}$ non-display driving unit NDn based on a reset control signal externally applied thereto. The reset control signal may be an $n+1^{th}$ gate signal GSn+1 applied from the $n+1^{th}$ stage. The fourth output discharge switching element Tr34 of the $n^{th}$ non-display driving unit NDn may be turned on or turned off based on the $n+1^{th}$ gate signal GSn+1 applied from the $n+1^{th}$ stage, and when being turned on, the fourth output discharge switching element Tr34 electrically may connect the output terminal OT11 of the $n^{th}$ non-display driving unit NDn and the second discharge power line VSL2.

The inverting unit INV of the $n^{th}$ non-display driving unit NDn illustrated in FIG. 12 may charge and discharge the reset node Qb of the $n^{th}$ stage STn based on a first control signal and a second control signal externally applied thereto. The inverting unit INV of the $n^{th}$ non-display driving unit NDn may include a first inverting switching element Tr41, a second inverting switching element Tr42, a third inverting switching element Tr43, a fourth inverting switching element Tr44, a first capacitor C11, and a second capacitor C22.

The first inverting switching element Tr41 of the $n^{th}$ non-display driving unit NDn illustrated in FIG. 12 may charge a first electrode of the first capacitor C11 based on the first control signal. The first control signal may be a first clock signal CLK1 applied from a first clock line CL11 in the non-display area AR2. The first inverting switching element Tr41 of the $n^{th}$ non-display driving unit NDn may be turned on or turned off based on the first clock signal CLK1. When being turned on, the first inverting switching element Tr41 may electrically connect the first clock line CL11 and the first electrode of the first capacitor C11.

The second inverting switching element Tr42 of the $n^{th}$ non-display driving unit NDn illustrated in FIG. 12 may discharge the first electrode of the first capacitor C11 based on the second control signal. The second control signal may be a signal applied to the output terminal OT11 of the $n^{th}$ non-display driving unit NDn. The second inverting switching element Tr42 of the $n^{th}$ non-display driving unit NDn may be turned on or turned off based on an $n^{th}$ gate signal GSn applied to the output terminal OT11 of the $n^{th}$ non-display driving unit NDn. When being turned on, the second inverting switching element Tr42 may electrically connect the first electrode of the first capacitor C11 and the second discharge power line VSL2.

The third inverting switching element Tr43 of the $n^{th}$ non-display driving unit NDn illustrated in FIG. 12 may charge the reset node Qb of the $n^{th}$ stage STn based on a signal applied to the first electrode of the first capacitor C11. The third inverting switching element Tr43 of the $n^{th}$ non-display driving unit NDn may be turned on or turned off based on the signal applied to the first electrode of the first capacitor C11. When being turned on, the third inverting switching element Tr43 may electrically connect the first clock line CL11 of the non-display area AR2 and the reset node Qb of the $n^{th}$ non-display driving unit NDn.

The fourth inverting switching element Tr44 of the $n^{th}$ non-display driving unit NDn illustrated in FIG. 12 may discharge the reset node Qb of the $n^{th}$ stage STn based on the second control signal. The second control signal may be a signal applied to the output terminal OT11 of the $n^{th}$ non-display driving unit NDn. The fourth inverting switching element Tr44 of the $n^{th}$ non-display driving unit NDn may be turned on or turned off based on the $n^{th}$ gate signal GSn applied to the output terminal OT11 of the $n^{th}$ non-display driving unit NDn. When being turned on, the fourth inverting switching element Tr44 may electrically connect the reset node Qb of the $n^{th}$ stage STn and the second discharge power line VSL2.

The first reset switching element Tr61 of the $n^{th}$ non-display driving unit NDn illustrated in FIG. 12 may discharge the set node Q of the $n^{th}$ stage STn based on a reset control signal externally applied thereto. The reset control signal may be an $n+2^{th}$ gate signal GSn+2 applied from the $n+2^{th}$ stage. The first reset switching element Tr61 of the $n^{th}$ non-display driving unit NDn may be turned on or turned off based on the $n+2^{th}$ gate signal GSn+2 applied from the $n+2^{th}$ stage. When being turned on, the first reset switching element Tr61 may electrically connect the set node Q of the $n^{th}$ stage STn and the first discharge power line VSL1.

The second reset switching element Tr62 and the third reset switching element Tr63 of the $n^{th}$ non-display driving unit NDn illustrated in FIG. 12 may discharge the set node Q of the $n^{th}$ stage STn based on a reset control signal externally applied thereto. The reset control signal may be an $n+1^{th}$ gate signal GSn+1 applied from the $n+1^{th}$ stage.

The second reset switching element Tr62 of the $n^{th}$ non-display driving unit NDn illustrated in FIG. 12 may be turned on or turned off based on the $n+1^{th}$ gate signal GSn+1 applied from the $n+1^{th}$ stage. When being turned on, the second reset switching element Tr62 may electrically connect the set node Q of the $n^{th}$ stage STn and the third reset switching element Tr63.

The third reset switching element Tr63 of the $n^{th}$ non-display driving unit NDn illustrated in FIG. 12 may be turned on or turned off based on a signal applied to the set node Q through the second reset switching element Tr62. When being turned on, the third reset switching element Tr63 may electrically connect the set node Q and the first discharge power line VSL1.

A second electrode of the first capacitor C11 illustrated in FIG. 12 may be connected to the reset node Qb of the $n^{th}$ stage STn.

The second capacitor C22 of the $n^{th}$ non-display driving unit NDn illustrated in FIG. 12 may be connected between the first clock line CL11 and the first electrode of the first capacitor C11.

Although not illustrated, other display driving units connected to the $n^{th}$ gate line GLn in common may have the same configuration as that of the $n^{th}$ display driving unit DDn illustrated in FIG. 12. In such an exemplary embodiment, a set switching element and an output switching element of each of the aforementioned other display driving units may be connected to the set node Q in common. In addition, output switching elements of the respective aforementioned other display driving units may be connected to the $n^{th}$ gate line GLn in common.

With reference to FIG. 12, the $n^{th}$ display driving unit DDn may be connected to the $n^{th}$ gate line GLn, while the $n^{th}$ non-display driving unit NDn may not be connected to the $n^{th}$ gate line GLn. Accordingly, the configuration of FIG. 12 may provide the same effects as those of the configuration illustrated in FIG. 7

Although not illustrated, in a case where three or more output switching elements and three or more set switching elements are distributed into the display area AR1 and the non-display area AR2, each of the output switching elements and the set switching elements may be reduced in size.

In FIG. 12, at least one of several switching elements included in the display driving unit DDn may be disposed in the non-display driving unit NDn rather than in the display driving unit DDn, and at least one of several switching elements included in the non-display driving unit NDn may be disposed in the display driving unit DDn rather than in the non-display driving unit NDn.

The switching elements included in the shift register SR may be formed in the same process as that of a thin film transistor of a pixel.

According to exemplary embodiments, the driving units included in the shift register may be distributed into the display area and the non-display area of the display panel. Accordingly, the plurality of switching elements provided in each of the driving units may be distributed into the display area and the non-display area. In particular, the output switching elements and the set switching elements having channels larger than those of other switching elements may be distributed into the display area and the non-display area such that the size of the output switching element and the set switching element in the non-display area may be reduced. As such, the thickness of the bezel of the display device may be reduced.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display device, comprising:
a display panel comprising a gate line and a data line; and
a shift register comprising a stage for driving the gate line,
wherein the stage comprises a first driving unit in a display area of the display panel and a second driving unit in a non-display area of the display panel,
wherein the first driving unit comprises a first output switching element including a source electrode, a drain electrode, and a gate electrode, the gate electrode being connected to a set node of the stage, and the first output switching element being connected between the gate line and a clock line,
wherein the first output switching element is disposed in the display area,
wherein one of the source and drain electrodes of the first output switching element is connected to the gate line, and another one of the source and drain electrodes of the first output switching element is connected to the clock line, and
wherein the set node of an $n^{th}$ Stage is charged with a set control signal comprising an $n-1^{th}$ gate signal applied from an $n-1^{th}$ stage, where n is an integer greater than 1.

2. The display device of claim 1, wherein the stage comprises at least two first driving units that are connected to the gate line in parallel.

3. The display device of claim 1, wherein the stage comprises at least two first driving units configured to apply gate signals to the gate line simultaneously.

4. The display device of claim 3, wherein each of the at least two first diving units comprises first output switching elements configured to apply the gate signals to the gate line simultaneously.

5. The display device of claim 1, wherein the first driving unit further comprises a first set switching element including a gate electrode connected to a previous stage, the first set switching element being connected between the previous stage and the set node.

6. The display device of claim 1, wherein the first driving unit further comprises a capacitor connected between the set node of the stage and the gate line.

7. The display device of claim 5, wherein the gate electrode of the first set switching element is supplied with a set control signal from the previous stage, the set control signal being a previous gate signal from the previous stage.

8. The display device of claim 1, wherein the gate signal from the first driving unit is applied to a subsequent stage operated subsequent to the stage.

9. The display device of claim 1, wherein the second driving unit comprises:
a first output discharge switching element including a gate electrode connected to a reset node of the stage, the first output discharge switching element being connected between the gate line and a discharge power line;
a second output discharge switching element including a gate electrode connected to a subsequent stage, the second output discharge switching element being connected between the gate line and a discharge power line; and an inverting unit connected to the reset node, the gate line, the discharge power line and the clock line.

10. The display device of claim 9, wherein at least one of the first driving unit and the second driving unit further comprises a first reset switching element including a gate electrode connected to the subsequent stage, the first reset switching element being connected between the set node and the discharge power line.

11. The display device of claim 10, wherein the gate electrode of the first reset switching element is supplied with a reset control signal from the subsequent stage, the reset control signal being a subsequent gate signal from the subsequent stage.

12. The display device of claim 10, wherein the second driving unit further comprises:
a second set switching element including a gate electrode connected to the previous stage, the second set switching element being connected between the previous stage and the set node,
a second output switching element including a gate electrode connected to the set node, the second output switching element being connected between the gate line and the clock line, and
a first holding switching element including a gate electrode connected to the reset node, the first holding switching element being connected between the set node and the discharge power line.

13. The display device of claim 12, wherein at least one of the set node of the stage and the reset node of the stage is positioned on at least one of the first driving unit and the second driving unit.

14. The display device of claim 9, wherein the inverting unit comprises:
a first inverting switching element including a gate electrode connected to the clock line, the first inverting switching element being connected between the clock line and the reset node; and
a second inverting switching element including a gate electrode connected to the set node, the second inverting switching element being connected between the reset node and the discharge power line.

15. The display device of claim 10, wherein an output terminal of the second driving unit is connected to at least one of the gate line, a subsequent stage, and a previous stage.

16. The display device of claim 9, wherein the first driving unit further comprises:
a second holding switching element including a gate electrode connected to the reset node, the second holding switching element being connected between the set node and the discharge power line;
a second reset switching element including a gate electrode connected to the subsequent stage, the second reset switching element being connected between the set node and the discharge power line; and
a third output discharge switching element including a gate electrode connected to the subsequent stage, the third output discharge switching element being connected between the gate line and the discharge power line.

17. The display device of claim 1, wherein the second driving unit comprises a third reset switching element including a gate electrode connected to a subsequent stage, the third reset switching element being connected between the set node and a discharge power line.

18. The display device of claim 17, wherein the second driving unit further comprises a third set switching element including a gate electrode connected to a previous stage, the third set switching element being connected between the previous stage and the set node.

19. The display device of claim 1, wherein a gate signal from the first driving unit is applied to a previous stage operated prior to the stage.

* * * * *